United States Patent [19]
Williams et al.

[11] Patent Number: 5,726,477
[45] Date of Patent: Mar. 10, 1998

[54] THRESHOLD ADJUSTMENT IN FIELD EFFECT SEMICONDUCTOR DEVICES

[75] Inventors: Richard K. Williams, Cupertino; Michael E. Cornell, Campbell, both of Calif.

[73] Assignee: Siliconix incorporated, Santa Clara, Calif.

[21] Appl. No.: 482,341

[22] Filed: Jun. 6, 1995

Related U.S. Application Data

[62] Division of Ser. No. 281,314, Jul. 27, 1994, Pat. No. 5,648,288, which is a continuation of Ser. No. 855,373, Mar. 20, 1992, abandoned.

[51] Int. Cl.$^6$ .................................................. H01L 29/76
[52] U.S. Cl. .................................. 257/402; 257/404
[58] Field of Search .............................. 257/403, 402, 257/404, 258

[56] References Cited

U.S. PATENT DOCUMENTS

| | | | |
|---|---|---|---|
| 3,461,361 | 8/1969 | Delivorias | 257/403 |
| 3,895,966 | 7/1975 | MacDougall et al. | 257/402 |
| 4,080,718 | 3/1978 | Richman | |
| 4,173,818 | 11/1979 | Bassous et al. | |
| 4,210,465 | 7/1980 | Brower | |
| 4,212,684 | 7/1980 | Brower | |
| 4,258,378 | 3/1981 | Wall | |
| 4,294,001 | 10/1981 | Kuo | |
| 4,329,186 | 5/1982 | Kotecha et al. | |
| 4,342,100 | 7/1982 | Kuo | |
| 4,356,042 | 10/1982 | Gedaly et al. | |
| 4,472,871 | 9/1984 | Green et al. | 257/403 |
| 4,514,893 | 5/1985 | Kinsbron et al. | |
| 4,525,378 | 6/1985 | Schwabe et al. | |
| 4,598,460 | 7/1986 | Owens et al. | |
| 4,737,471 | 4/1988 | Shirato et al. | 257/402 |
| 4,764,482 | 8/1988 | Hsu | 437/57 |
| 4,845,047 | 7/1989 | Holloway et al. | |
| 4,866,002 | 9/1989 | Shizukuishi et al. | |
| 4,889,820 | 12/1989 | Mori | |
| 4,927,776 | 5/1990 | Soejima | 437/33 |
| 4,956,311 | 9/1990 | Liou et al. | |
| 4,960,726 | 10/1990 | Lechaton et al. | 437/59 |
| 4,968,639 | 11/1990 | Bergonzoni | |
| 5,036,019 | 7/1991 | Yamane et al. | |
| 5,118,633 | 6/1992 | Sagara et al. | |
| 5,169,794 | 12/1992 | Iranmanesh | |

OTHER PUBLICATIONS

J. Y.-C. Sun et al., "Study of Boron Penetration Through Thin Oxide With P+-Polysilicon Date", Digest of Technical Papers, May 1989 Symposium on VLSI Tech., Kyoto, Japan, pp. 17–18.

K.A. Sabine, et al., "Threshold shift of NMOS transistors due to high energy arsenic source/drain implantation", IEEE Proceedings vol. 132, pt. 1, No. 3, Jun. 1985, pp. 163–166.

*Primary Examiner*—Jerome Jackson
*Assistant Examiner*—Nathan K. Kelley
*Attorney, Agent, or Firm*—Skjerven, Morrill, MacPherson, Franklin & Friel; David E. Steuber

[57] ABSTRACT

A process for fabricating both CMOS and LDMOS transistors includes a high temperature, long diffusion subsequent to deposition of the polysilicon gate for forming MOSFET body regions. Similarly, a process for fabricating both CMOS and NPN transistors includes a high temperature, long diffusion subsequent to deposition of the polysilicon gate for forming NPN base regions. In both processes, the threshold voltage of the PMOS devices is adjusted subsequent to both gate formation and the high temperature, long diffusions by implanting a suitable dopant into the PMOS channel through the gate. Since the gate is formed prior to threshold adjust, high temperature processing and long diffusions requiring the presence of the gate are completed without adversely affecting the adjusted threshold voltage. The p+ source/drain implant mask can be used to restrict the threshold adjust implant to the PMOS devices, thereby avoiding adversely affecting other devices in the integrated circuit. The p+ source/drain implant mask can also be used to protect the gates of some of the PMOS devices, thereby fabricating two classes of PMOS devices, one being threshold adjusted and the other not being threshold adjusted. The threshold adjusted devices may be either enhancement or depletion mode.

12 Claims, 16 Drawing Sheets

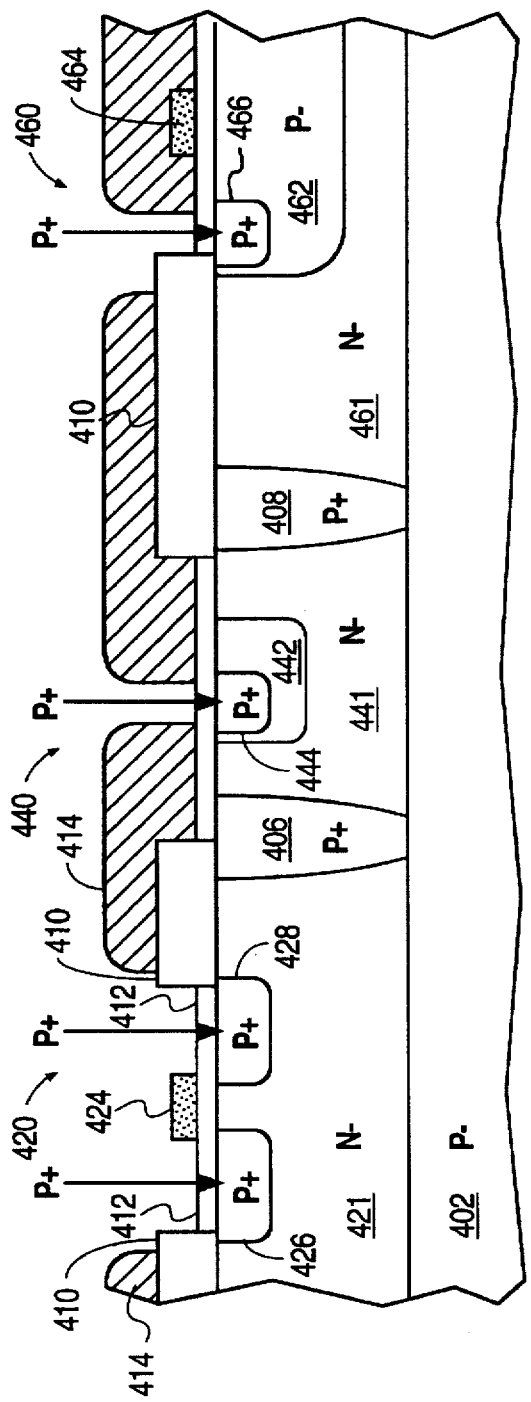
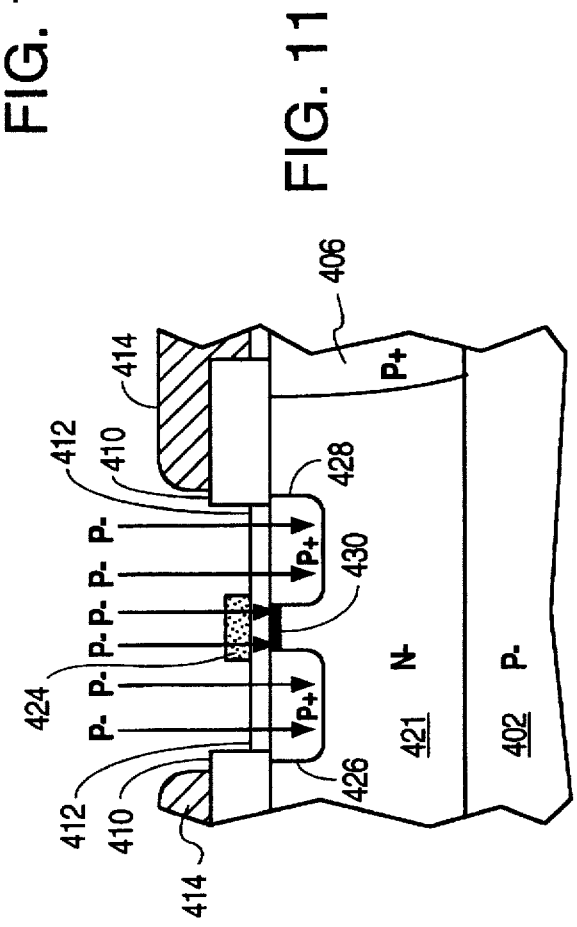

THRESHOLD ADJUSTMENT IN FIELD EFFECT SEMICONDUCTOR DEVICES

This application is a division of application Ser. No. 08/281,314, filed Jul. 27, 1994, now U.S. Pat. No. 5,648,288 which is a continuation of Ser. No. 07/855,373, filed Mar. 20, 1992, now abandoned.

BACKGROUND OF THE INVENTION

1. Field of the Invention

The present invention pertains to a method for adjusting a semiconductor device threshold voltage during device fabrication, and more particularly to adjusting the threshold voltage of an insulated gate field effect device by high energy ion implantation through the gate thereof.

2. Description of Related Art

The threshold voltage $V_t$ for MOSFET transistors is defined as the voltage $V_{gs}$ applied between gate and source, below which the MOS transistor drain-to-source current $I_{ds}$ becomes zero. The threshold voltage for n-channel and p-channel devices are denoted $V_{tn}$ and $V_{tp}$, respectively. The threshold voltage is a function of a number of parameters, including the gate material, the gate insulation material, the gate insulator thickness, the channel doping, the impurities at the silicon-insulator interface, and the voltage $V_{sb}$ between the source and substrate.

Many integrated circuit designs use MOSFET devices with other device types or both high and low power PMOS and NMOS devices. For example, smart power devices generally include a variety of small signal analog and digital CMOS devices combined with DMOS transistors on the same substrate. When, for example, PMOS devices are formed with NMOS and DMOS devices in a D/CMOS process or with NPN devices in a BiCMOS process, the $V_{tp}$ of the PMOS devices is not as low as might be desired, especially for use with low voltage power supplies. For example, in a D/CMOS process for fabricating 15 volt devices in which the gate oxide thickness specification is 1,000 Angstroms ("Å"), a typical PMOS transistor of 5 μm p+ poly gate length exhibits a 2.5 volt threshold, which is acceptable for a 15 volt integrated circuit. In scaling such a process for a 5 or 12 volt power supply, the gate oxide specification is scaled to 580 Å thickness. The NMOS threshold nicely reduces from 1.8 volts to 1.1 volts. Unfortunately, the improvement in PMOS threshold is considerably less, dropping from 2.5 volts to only 2.1 volts. This PMOS threshold is generally unsatisfactory for a 5 or 12 volt integrated circuit. Further thinning of the gate insulator thickness is undesirable since it limits the maximum allowable gate voltage. For example, a 300 Å gate oxide may be safely operated only up to a maximum gate drive of 12 volts, leaving no margin for supply variations in a 12 volt system. Even if a 5 volt system is used, the threshold voltage remains above 1.4 volts due to oxide independent terms in the $V_t$ equation.

Known techniques for threshold adjust are not entirely satisfactory for use in some mixed device-type processes. For example, while the PMOS threshold in a D/CMOS can be reduced by using a more lightly doped n-well, the more lightly doped n-well results in lower punchthrough breakdown and adversely affects other device types for which the process is intended.

Channel doping is a well known technique for threshold adjustment. Channel doping involves varying the doping concentration at the silicon-insulator interface. In CMOS processes, channel doping typically is done prior to deposition of the gate polysilicon. Generally, the technique is not applicable to processes in which two and possibly more successive diffusions are used, such as processes that include steps for fabricating NPN devices in which a base must be diffused deeper than the emitter, and processes that include steps for fabricating DMOS devices in which a body region must be diffused deeper than a source. Impurity distribution in diffusion processes is dependent on the product of the diffusion coefficient D(T) and the time, or $\sqrt{Dt}$ (hereinafter "root Dt"). In double-diffused and triple-diffused bipolar devices and double diffused MOSFET devices, the root Dt is large, ranging from 0.3 or 0.4 microns all the way down to 1.0 or 1.5 microns. When exposed to such large root Dt values, the threshold dopant diffuses too deeply into the substrate, forming a leakage path between the source and the drain of the MOSFET which is not pinched off at $V_{gs}=0$.

The necessity for using only low temperature processing following the channel doping step has been a significant motivating factor in classical VLSI and integrated circuit process design. Unfortunately, flexibility of device type remains limited, particularly in analog integrated circuits or in power integrated circuits.

Another conventional technique for reducing $V_{tp}$ of a PMOS device, one which is useful even in processes having long diffusion times after the polysilicon deposition step, is to use boron-doped p-type polysilicon gates in association with the PMOS devices, instead of phosphorus-doped n-type polysilicon gates. The p-type polysilicon has a different work function, so that the threshold of the PMOS devices is shifted by about a volt. Unfortunately, this technique is not entirely satisfactory for use in processes specifying a thin gate oxide, as the boron from the p-type polysilicon penetrates easily through the thin gate oxide in any subsequent diffusion steps and can counterdope the channel. Leakage and other problems result. Moreover, this problem is exacerbated by the presence of hydrogen. While the risk is reduced by the use of a thicker gate oxide, say on the order of 1000 Å, the requirement for a thicker gate oxide compromises process flexibility. Moreover, whether a thin or thick gate oxide is used, the design of CMOS inverters is complicated. Typically in a CMOS inverter, the interconnect between the PMOS and NMOS devices is formed by the polysilicon gates themselves. If n-type poly is associated with the n-channel devices and p-type poly is associated with the p-channel devices, a diode rather than a closed circuit forms where the two differently doped polysilicon gates abut. While this problem can be solved by the use of strapping metal to short out the diode, the fabrication of the strapping metal adds complexity to the process.

A need, therefor, exists for a technique for adjusting the $V_t$ of MOSFET devices in processes that allow fabrication of mixed device types, while preserving the ability to use long diffusion and high temperature steps subsequent to polysilicon gate deposition.

SUMMARY OF THE INVENTION

To adjust the threshold voltage of an insulated gate device in a semiconductor fabrication process, an implant of a suitable dopant is made into the channel through the gate electrode and gate insulation. Since the gate is formed prior to threshold adjust, high temperature processing and long diffusions requiring the presence of the gate may be completed without risk to the adjusted device threshold.

In another embodiment, the insulated gate device is a PMOS transistor having a polysilicon gate and a gate oxide. The p+ source/drain implant mask is used to restrict the threshold adjust implant to the PMOS device, thereby avoiding any adverse effect on other devices in the integrated circuit. Advantageously, no additional masking step is required in this embodiment. In a further embodiment, the gates of some PMOS devices are protected by the p+ source implant mask. Advantageously, two classes of PMOS devices result, one being threshold adjusted and the other not being threshold adjusted.

BRIEF DESCRIPTION OF THE DRAWINGS

FIG. 4 is illustrated as FIGS. 4A, 4B, and 4C.

FIGS. 9-12 are cross-sectional views of a PMOS device region, an NMOS device region, and an NPN device region in successive stages of fabrication in accordance with a BiCMOS junction isolation process.

DETAILED DESCRIPTION OF THE PREFERRED EMBODIMENT

While the following discussion is in the context of a p-type threshold adjust implant into a p-channel MOSFET, the discussion is generally applicable to other species, including n-type.

Figure 1:
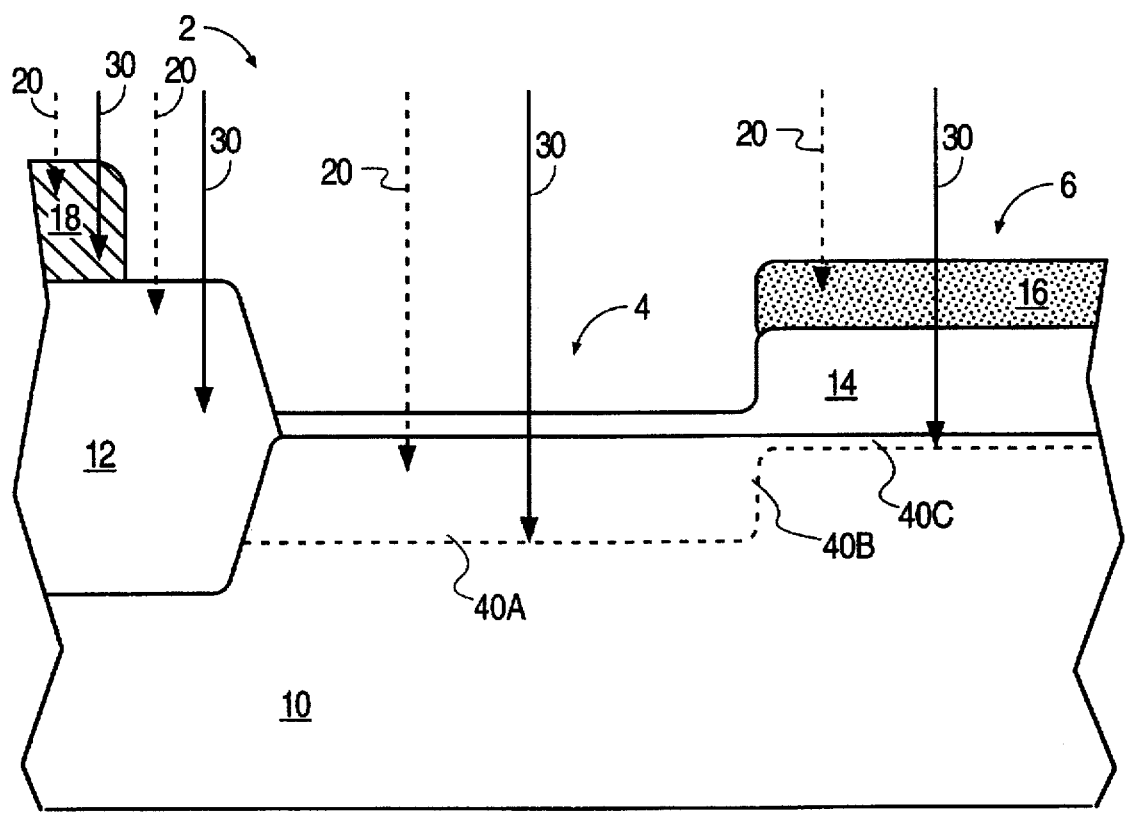
FIG. 1 is a cross-sectional view of a intermediate PMOS semiconductor structure in which two implants, a source/drain implant and a threshold adjust implant, are represented.

FIG. 1 represents two p-type implant operations made during an arbitrary MOSFET transistor fabrication process. A MOSFET device intermediate 2 is a conventional structure comprising an n-type silicon body 10, which may be substrate material, epitaxial material, or an n-type well diffused into a p-type substrate, a field oxide region 12 partially overlaid by a photoresist film 18, and a gate structure 6 comprising a gate oxide film 14 overlaid by gate polysilicon film 16. Region 4 is the device source region or the device drain region, as the case may be, and may or may not be covered by oxide. If oxide is present on region 4, it may be etched back to under 500 Å following polysilicon gate formation and photomasking to allow the subsequent source/drain implant to penetrate into the n-type silicon body 10, although an etch back generally is not needed if the oxide thickness is under 500 Å or if arsenic is not required in the NMOS transistors elsewhere. A p+ source/drain implant is represented by dashed vertical lines 20. The solid vertical lines 30 represent a relatively small dose, high energy p-type threshold adjust implant.

The depth to which an ion becomes implanted is proportional to its kinetic energy. The implanted distribution in an amorphous target is roughly a Gaussian distribution characterized by a mean, known as the range, and a standard deviation, known as the straggle. In a single crystal target, the range and straggle for a given implant may be different than that in amorphous material, due to a phenomena known as channeling. Higher ion energy, higher silicon temperature, and the growth of silicon dioxide layers on the silicon all tend to dechannel implants. In any event, range and straggle data for various materials including silicon, silicon dioxide, and photoresist have been determined and reported in such reference works as O. D. Trapp, R. A. Blanchard, L. J. Lopp, and T. I. Kamins, Semiconductor Technology Handbook, 1985, and are incorporated herein by reference.

In the region demarcated by field oxide 12, which in some processes may be wholly or partially covered by a layer of photoresist 18, neither the source/drain implant 20 nor the threshold adjust implant 30 penetrates through the field oxide 12 into the silicon substrate 10. Hence, the regions of substrate 10 overlaid by field oxide region 12 are unaffected by the implants 20 and 30. Note that in some processes (not shown), photoresist may directly cover a portion of the substrate 10 and block penetration of the implants 20 and 30 into the substrate 10.

Figure 2:
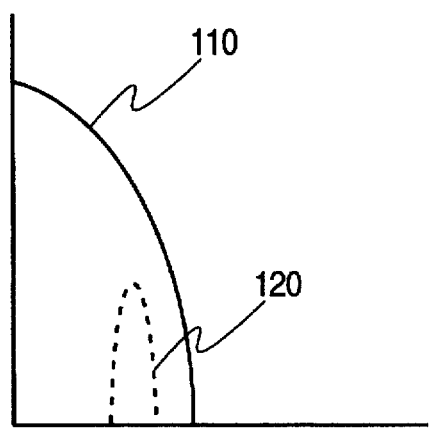
FIG. 2 is a graph of p-type dopant profiles in the source/drain region of the PMOS intermediate structure of FIG. 1, resulting from the implants shown in FIG. 1 after diffusion.

In the source/drain region 4, both the source/drain implant 20 and the threshold adjust implant 30 penetrate into the substrate 10. As the threshold adjust implant 30 is made with higher energy, it penetrates more deeply into the substrate 10 than the source/drain implant 20. The region of peak concentration resulting from the threshold adjust implant 30 is generally indicated by reference numeral 40. The range of the threshold adjust implant 30 is affected by the source/drain implant 20. If the source/drain implant 20 is made first, the range of the threshold adjust implant 30 is somewhat reduced because it must pass through portions of the silicon substrate 10 amorphized by the source/drain implant 20. In other words, channeling is reduced. In any event, the threshold adjust implant 30 is of little practical significance in the source/drain region, since the relatively heavy dose implanted in the source/drain implant 20 tends to diffuse deeply and supersede the relatively light concentration of the $V_{tp}$ implant. This is shown in the graph of FIG. 2, in which curve 110 represents the profile of the dopant implanted in the source/drain implant 20 after diffusion, and curve 120 represents the post-diffusion profile of the dopant implanted in the threshold adjust implant 30. Hence, under many process conditions, the device source/drain region is for all practical purposes determined by the source/drain implant 20 alone. The $V_{tp}$ adjust implant may not even appear in the tail distribution.

The effect in gate area 6 is quite different. Although of a high dose, the source/drain implant 20 has insufficient energy to penetrate the material of which the gate structure 6 is fabricated, which in FIG. 1 is a polysilicon film 16 on an oxide film 14. The high energy threshold adjust implant 30, in contrast, penetrates the gate structure 6 into the channel region of the device intermediate 2.

Figure 3:
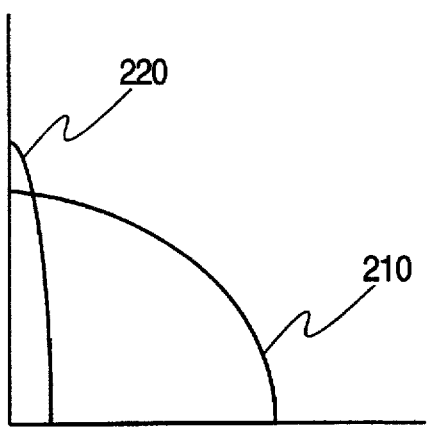
FIG. 3 is a graph of two dopant profiles under the gate region of the PMOS intermediate structure of FIG. 1, one being a p-type threshold adjust dopant profile resulting from the implants shown in FIG. 1, and the other being a conventional channel dopant profile after a body and base diffusion.

The energy of the threshold adjust implant 30 preferably is set so that the implant peak 40C of the dopant implanted through the gate structure 6 is within the substrate 10 but very close to the surface thereof. This is shown in the graph of FIG. 3, in which curve 220 represents the post-diffusion profile of the dopant implanted in the threshold adjust implant 30. The total charge from the ionized implant present in the silicon is $$\frac{Q}{A} = \int N(x)dx$$

where Q/A is the dose penetrating into the silicon. As long as the charge remains within electrostatic control of the gate, the degree of threshold adjust is $V_{tp} \approx (Q/A)/C_{ox}$, and is not dependent on the surface concentration.

Compare curve 220 representing the profile of the dopant implanted in the threshold adjust implant 30 with curve 210 representing the post-diffusion profile of a dopant implanted in a conventional pre-polysilicon deposition $V_{tp}$ adjust subjected to a body and base diffusion. It will be appreciated that the electrostatic control of the gate must reach much deeper in a device having the $V_{tp}$ adjust profile 210 than a device having the $V_{tp}$ adjust profile 220.

The high energy threshold adjust implant 30 is useful in any process requiring threshold adjusted MOSFET devices, but is particularly useful in conjunction with D/CMOS and BiCMOS processes in which the primary devices fabricated are n-channel devices, but p-channel devices are fabricated as well. p-channel devices fabricated in D/CMOS and BiCMOS low power processes typically have too high of a $V_{tp}$ threshold, so that threshold adjustment is needed. PMOS device formation in a D/CMOS process, in which such devices as n-channel LDMOS transistors are dominant, is affected by similar thermal concerns as PMOS device formation in a BiCMOS process, in which NPN devices are dominant. An illustrative D/CMOS process, which is a countersunk oxide isolation process, is shown in FIGS. 4–8. An illustrative BiCMOS process, which is a junction-isolated process, is shown in FIGS. 9–13.

In the D/CMOS process of FIGS. 4 through 8, a PMOS device region 320, an NMOS device region 330, an n-channel LDMOS device region 340, and an NPN device region 350 are shown in successive stages of fabrication. While the dominant device formed by the process is the LDMOS transistor, the process is also suitable for NPN transistor fabrication; hence, NPN device region 350 is shown for purposes of completeness. The starting material is a p-type wafer having a crystallographic orientation of <100>, into which n+ and p+ buried layers (not shown) have been diffused. A 15 to 20 μm n-type epitaxial layer of a desired resistivity is grown, although thinner epitaxial layers may be used for lower voltage processes. To form the conventional intermediate structure shown in FIG. 4, an initial oxide film (not shown) is grown on the substrate 302 using any suitable technique such as, for example, thermal oxidation. The initial oxide film is suitably patterned and etched to form an n-well implant mask having a window in PMOS device region 320 and a window in NPN device region 350. The initial oxide film is left intact in the NMOS device region 330 and the LDMOS device region 340. An n-type dopant, typically phosphorus, is diffused to form the n-well 322 and the collector 352. Typically, n-wells are formed above and overlapping n buried layers. The initial oxide mask is removed.

The process thus far may be varied to achieve different properties. For example, one p-type region can be used for the bodies of the LDMOS devices or for the bases of the NPN devices, or various p-type regions can be fabricated using different masks and different doping to meet different electrical performance requirements.

Figure 4A:
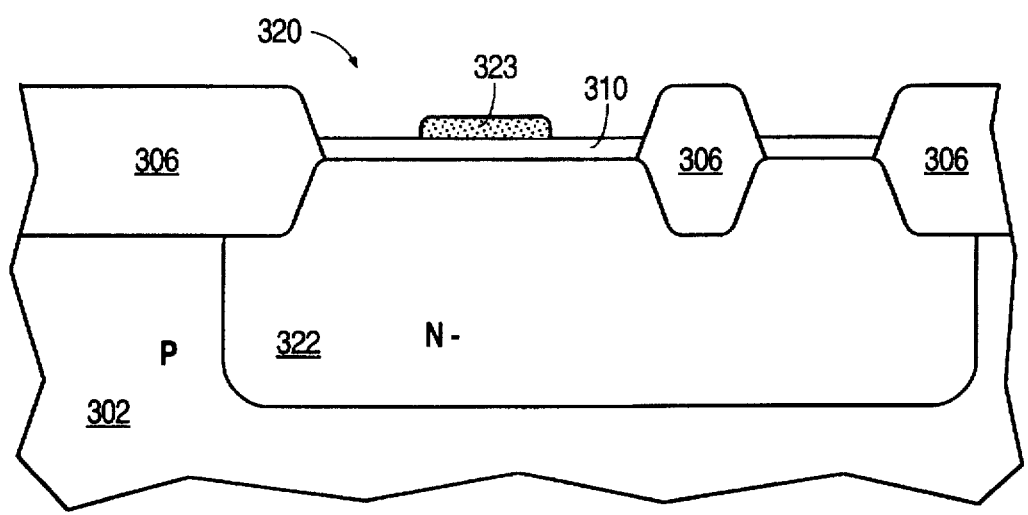
FIGS. 4-8 are cross-sectional views of a PMOS device region, an NMOS device region, a lateral DMOS ("LDMOS") device region, and an NPN device region in successive stages of fabrication in accordance with a D/CMOS oxide isolation process. Each of FIGS. 4-6 and 8 consists of separate "A", "B", and "C" portions. For example.
Figure 4B:
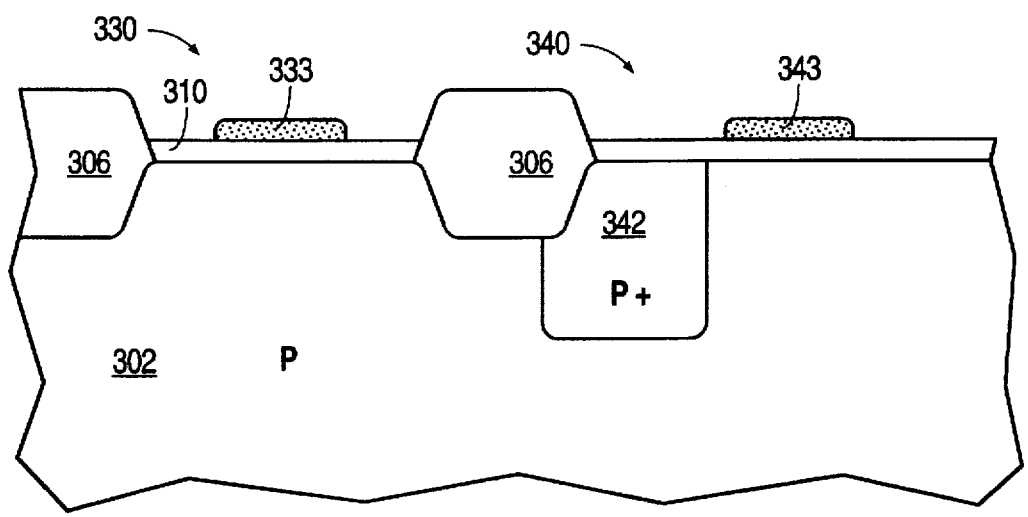
Figure 4C:
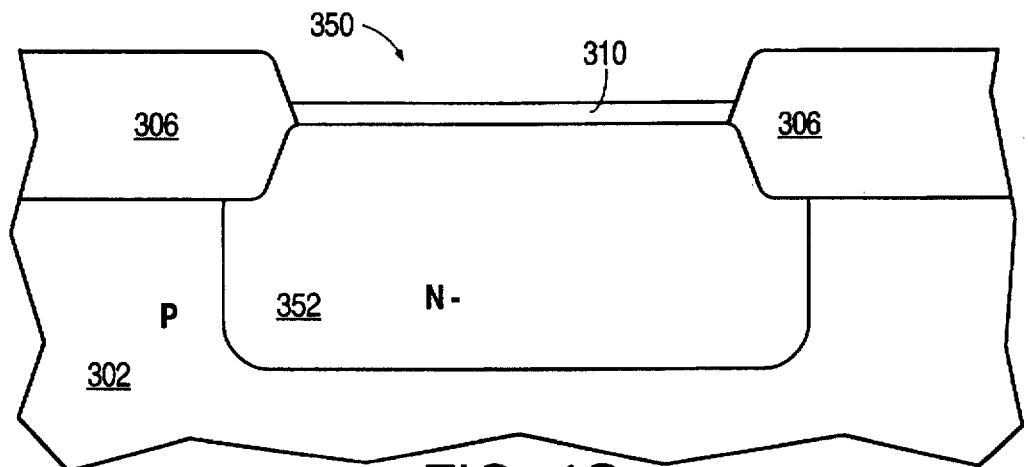

Formation of the intermediate structure of FIG. 4 continues by forming a field oxide 306 in any suitable manner such as by the LOCOS or ISOPLANAR processes. For example, a silicon nitride film (not shown) is deposited and patterned to open windows over substrate regions that are thermally oxidized to form field oxide 306 bordering device regions 320, 330, 340, and 350. If desired, an additional p+ mask, implant and drive-in is made prior to oxidation to form heavily doped regions for substrate contact (not shown) in the NMOS device region 330 and the deep p+ region 342 in the LDMOS device region 340. Further, if desired, a p+/n+ field dope mask and implant is made prior to oxidation to form regions (not shown) under field oxide 306 for raising the field threshold of the parasitic MOS transistors between devices. The field dopings are p-type in p regions and n-type in n-wells, and typically are formed by making an implant of n-type impurity into the substrate 302 through the field oxide mask, followed by an additional photoresist mask for the compensating p-type doping. Alteratively, the p-type and the n-type regions can be formed with their own implant masks, thereby eliminating the need for counterdoping but involving the use of an additional mask. The nitride film is stripped, and the exposed areas of substrate 302, which are the active device areas, are etched back to remove damage. Generally, a thin thermal oxide is formed in the exposed areas of substrate 302 and is etched away to remove damage. A second thin thermal oxide is formed in the exposed areas in the device regions 320, 330, 340 and 350 using any suitable technique, to form the gate oxide 310. The factors governing oxide thickness are discussed below.

The process for forming the intermediate structure of FIG. 4 continues with the deposition of a polysilicon film, which is suitably patterned to form polysilicon gate feature 323 in the PMOS device region 320, polysilicon gate feature 333 in the NMOS device region 330, and polysilicon gate feature 343 in the LDMOS device region 340. The polysilicon gates 323, 333 and 343 are heavily doped with an n-type impurity, generally phosphorus, either during deposition of the polysilicon film or in an implant into the film after deposition. Generally, doping precedes the patterning and etching of the polysilicon film, although the polysilicon features may be doped after having been etched, if desired.

Figure 5A:
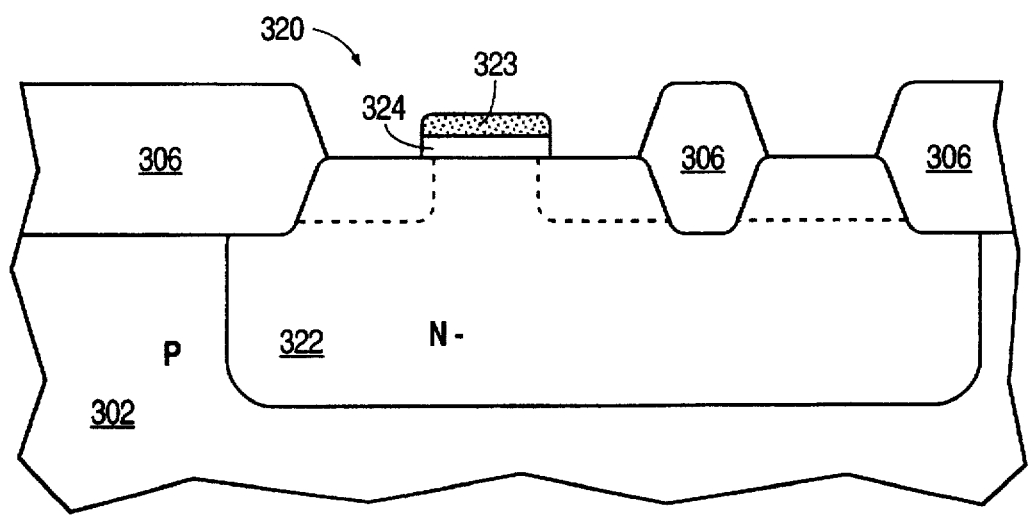
Figure 5B:
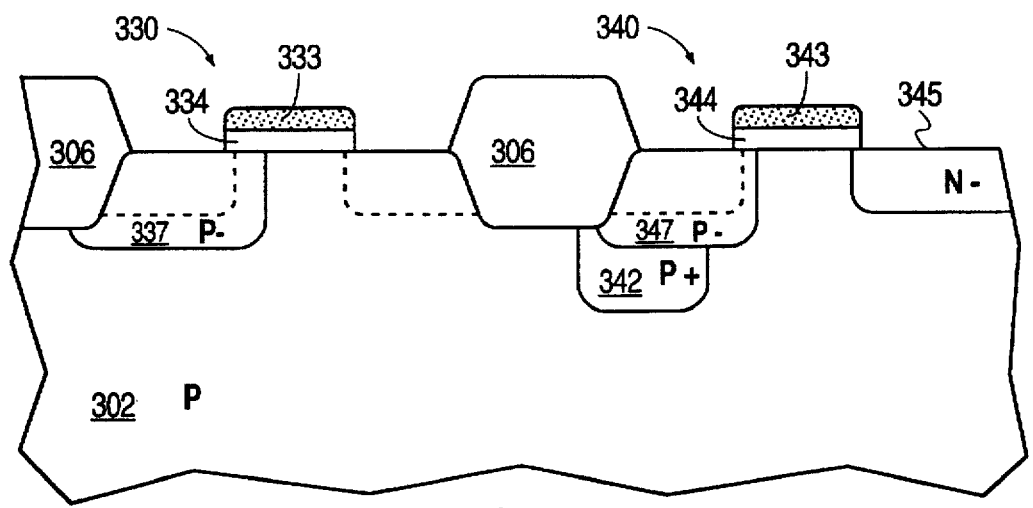
Figure 5C:
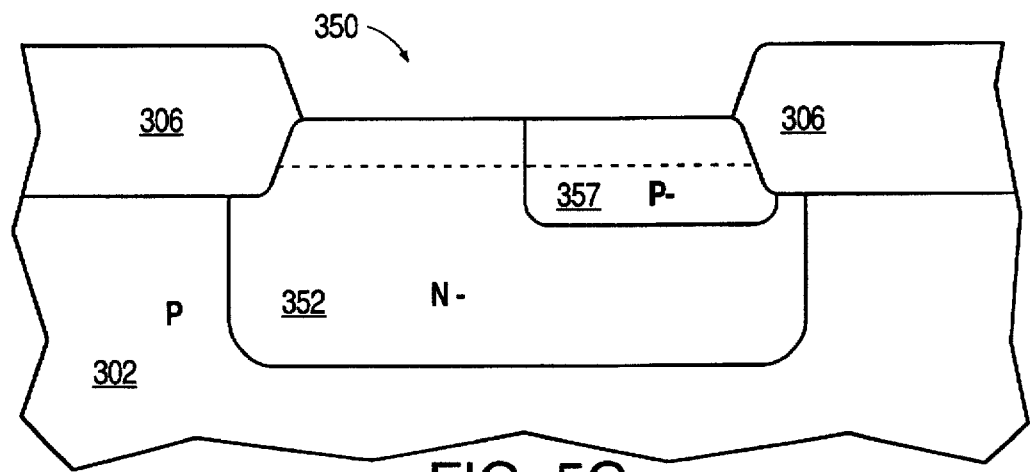

The intermediate structure of FIG. 5 is formed by a n– drift region implant and a p– body mask, implant and drive-in. The body implant is made to set the channel concentration in the LDMOS device region 340 and, if desired, in the NMOS device region 330, and to set the base concentration in the NPN device region 350. Typically, the body diffusion is the longest and highest temperature diffusion in a D/CMOS process other than the n-well diffusion, accounting for 75% to 95% of the root Dt of the process exclusive of the n-well diffusion. Hence, the body diffusion would deeply drive in any prior threshold adjust implant for the PMOS device in device region 320, with possibly catastrophic results. In other words, conventional threshold adjusting implants are incompatible with D/CMOS and higher voltage BiCMOS processes.

The drift region and body implants are made as follows. First, the oxide film 310 is removed by etching to form a gate oxide feature 324 under the gate 323 in the PMOS device region 320, to form a gate oxide feature 334 under the gate 333 in the NMOS device region 330, to form a gate oxide feature 344 under the gate 343 in the LDMOS device region 340, and to open windows to the substrate 302 about the gate oxide feature 324 in the PMOS region 320, about the gate oxide feature 334 in the NMOS device region 330 and about the gate oxide feature 344 in the LDMOS device region 340. Note, however, that the gate oxide over the regions to be implanted may remain through the body and subsequent drift region implants, or may be only partly etched, or may be regrown, as desired.

Next, a blanket n− drift region implant is made using a suitable n− type dopant such as phosphorus at a dose of, for example, $10^{12}$ atoms/cm$^2$ and an energy of, for example, 80 to 120 keV.

Next, photoresist is deposited and patterned to form an opening to the source area to the left of the polysilicon feature 333 in the NMOS device region 330, an opening to the source area to the left of the polysilicon feature 343 in the LDMOS device region 340, and an opening over the rightmost section of the NPN device region 350. Note that the device being formed in the NMOS device region 330 is an asymmetrical body device, and that, if desired, the drain area to the right of the gate oxide feature 334 may be opened as well to create a symmetrical body device. A p-body implant is made through these openings using a suitable p-type dopant such as boron at a dose generally in the range of $10^{13}$ to $10^{14}$ atoms/cm$^2$, such as, for example, $5 \times 10^{13}$ atoms/cm$^2$, and an energy generally in the range of 80 to 120 keV. The p-body implant is driven in at a temperature generally in the range of 1100° to 1150° C. for a time generally in the range of 5 to 13 hours to form body regions 337 and 347 and base region 357, and the same diffusion step drives in the n− drift region implant to form drift region 345 generally in the range of 1–2.5 μm. Because the drift is more lightly doped, its final diffusion depth is more shallow than the p-body depth. (Although regions 337, 347, and 357 are labeled as "P−" in the drawings, these regions are more heavily P doped than P substrate 302.) Regions 337, 347 and 357 extend into the substrate to a depth of about 4 μm, although it could be deeper or shallower as desired, and extend laterally under the field oxide 306. For example, n− drift region 345 is formed to a depth of about 1.8 microns. Other n-regions, shown bounded by dashed lines in FIG. 5, would also be formed, but are eventually superseded by p+ or n+ implants. In process where a blanket n− drift is a problem, an additional masking operation can be performed to isolate the n-drift implanted regions.

A number of variations may be made at this point in the process. In one variant, if no DMOS transistors and no high voltage NMOS transistors are to be made, no openings into NMOS device regions would be made since no body implant would be needed. In another variant, the p-body and p-base implants may be made in separate mask steps at different doses and/or energies, and exposed to either the same diffusion or different diffusions.

Figure 6A:
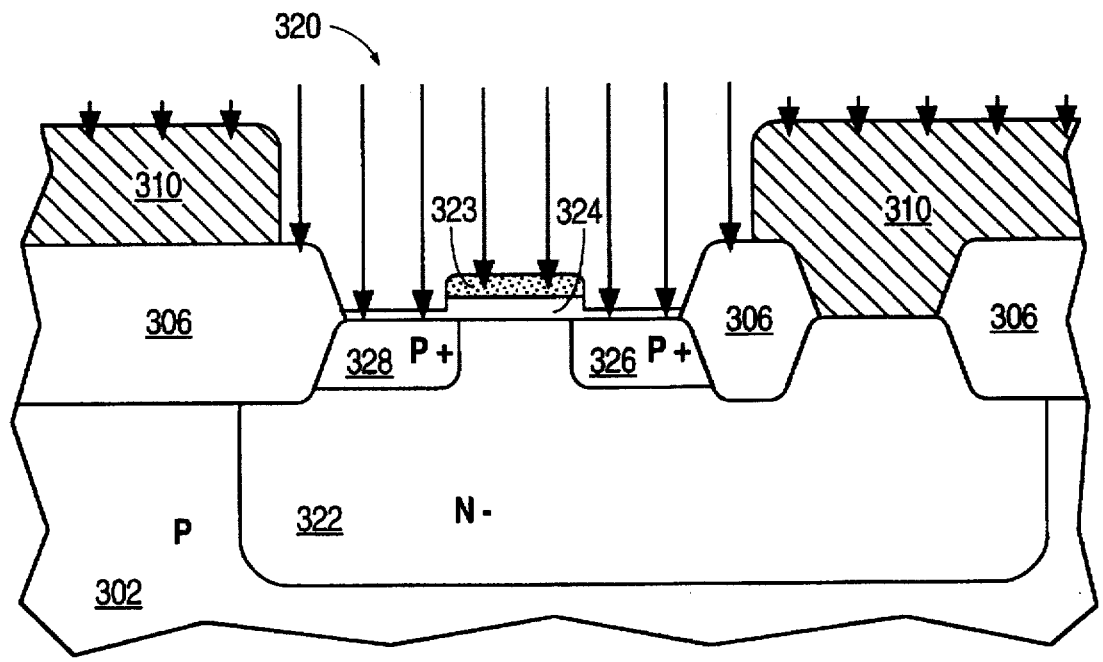
Figure 6C:
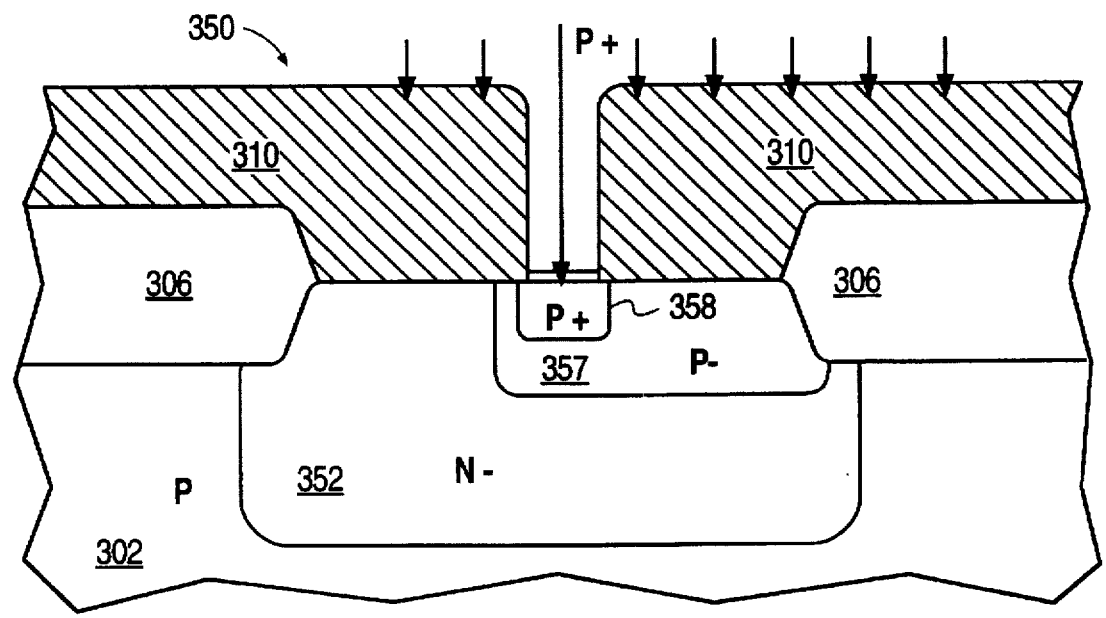
Figure 6B:
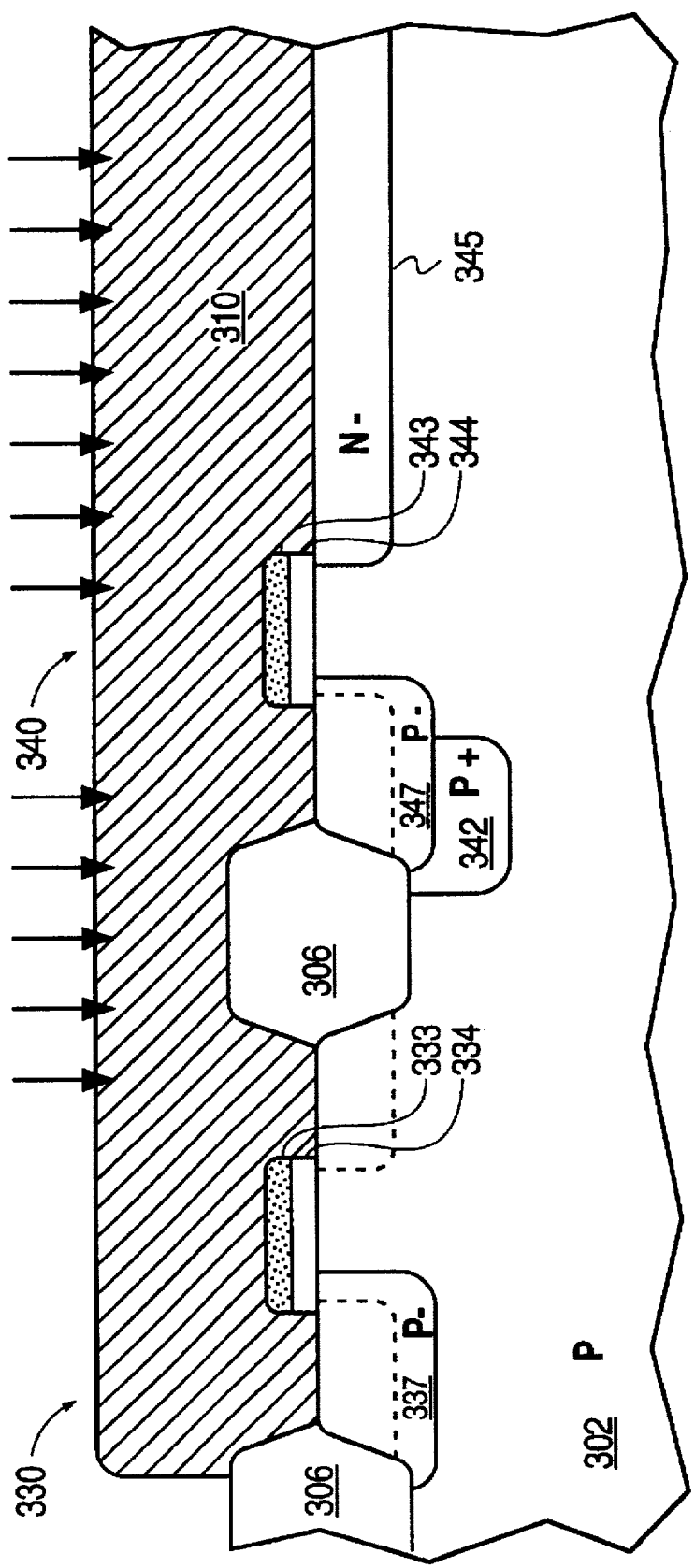

Next, the intermediate structure of FIG. 6 is formed as follows. Photoresist 310 is deposited and patterned to selectively open windows into active area regions in which a p+ implant is desired, such as, for example, PMOS source region 328 and drain region 326, and base electrical contact region 358. Next, a suitable p-type dopant such as boron is implanted using, for example, a dose generally in the range of $8 \times 10^{14}$ to $5 \times 10^{15}$ atoms/cm$^2$ such as $1 \times 10^{15}$ atoms/cm$^2$, at an energy generally in the range of 80 to 120 keV. Next, the dopant is driven in to form PMOS source 328, PMOS drain 326, and NPN base contact region 358, varying from a rapid thermal anneal to 45 minutes at 1100° C., depending on the required source/drain junction depth. In the PMOS device region 320, the source 328 and drain 326 are self-aligned with the gate polysilicon 323.

Note that the immediately preceding implant-drive in sequence can be modified to create symmetric p-body PMOS devices by first implanting and partially driving-in a p-type body implant, then continuing with the source/drain implant and drive-in. Similarly, asymmetric p-body PMOS devices can be created by masking PMOS source areas, then implanting to the drain areas and partially driving-in a p-type body implant, then continuing with the source/drain implant and drive-in.

Figure 7:
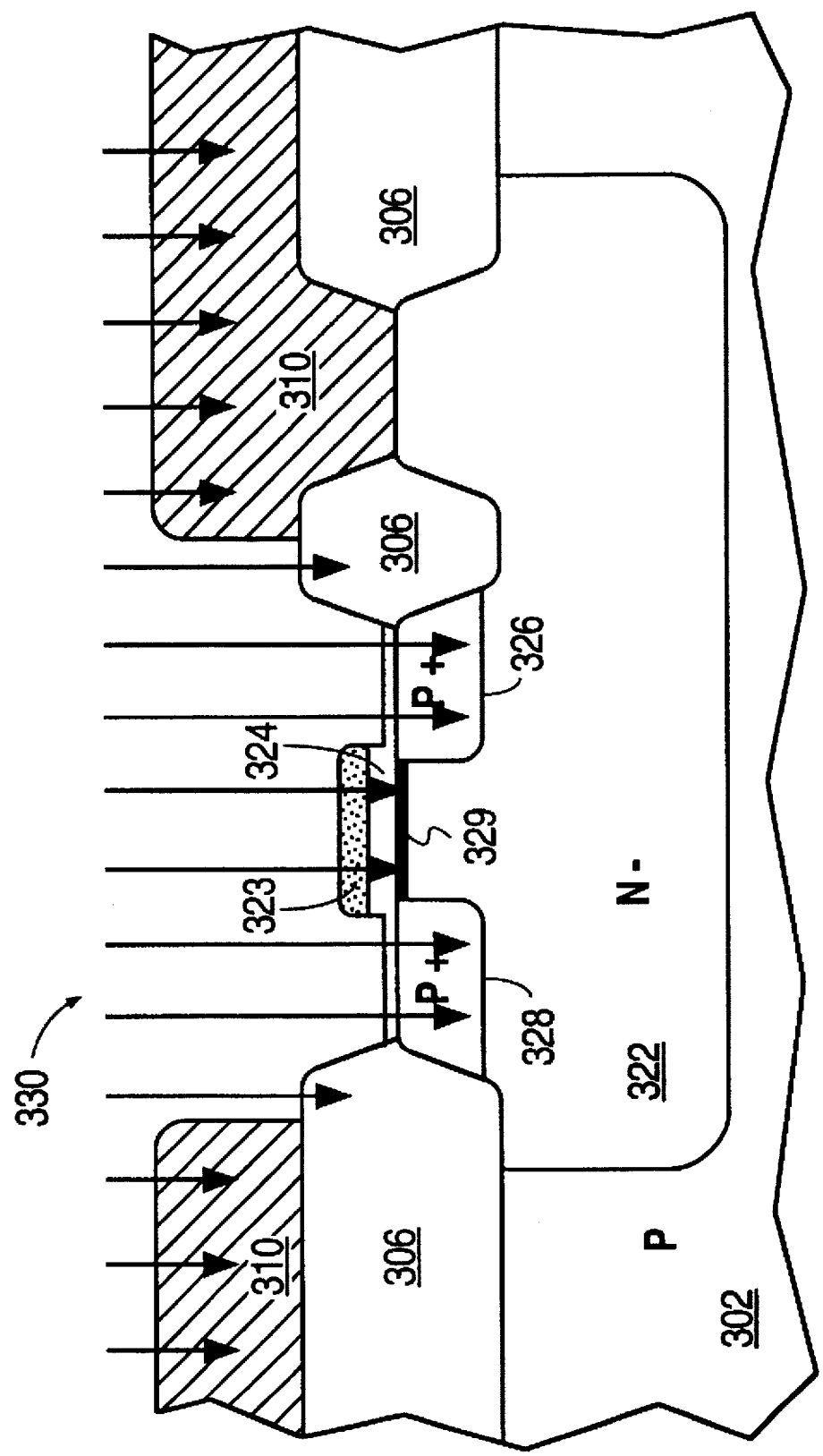

Next, as shown in FIG. 7, a high energy p+ threshold adjust implant is made through the same photoresist mask as the source/drain/contact implant, without removing photoresist. A suitable p type dopant such as, for example, boron is used, and is implanted at a suitable dose and energy. The considerations involved in selecting a suitable dose and energy are described below. Note that the thickness of photoresist 310 is sufficient to prevent the high energy threshold adjust implant from reaching protected structures in other parts of the integrated circuit. Note also that the high energy threshold adjust implant has no significant electrical effect where it enters previously doped p+ regions such as source 328, drain 326, and base contact 358. The threshold adjust implant is, however, effective in the channel region 329 between source 328 and drain 326, since the relatively low dose implant is made at such an energy that it penetrates through the polysilicon gate 323 and the gate oxide 324, and stops just under the top of the n-well 322 beneath the gate oxide 324 to form a region of p-type material in the silicon that is thin enough to avoid leakage but sufficient to lower the threshold of the PMOS. The source/drain/contact photoresist mask 310 is removed.

Figure 8A:
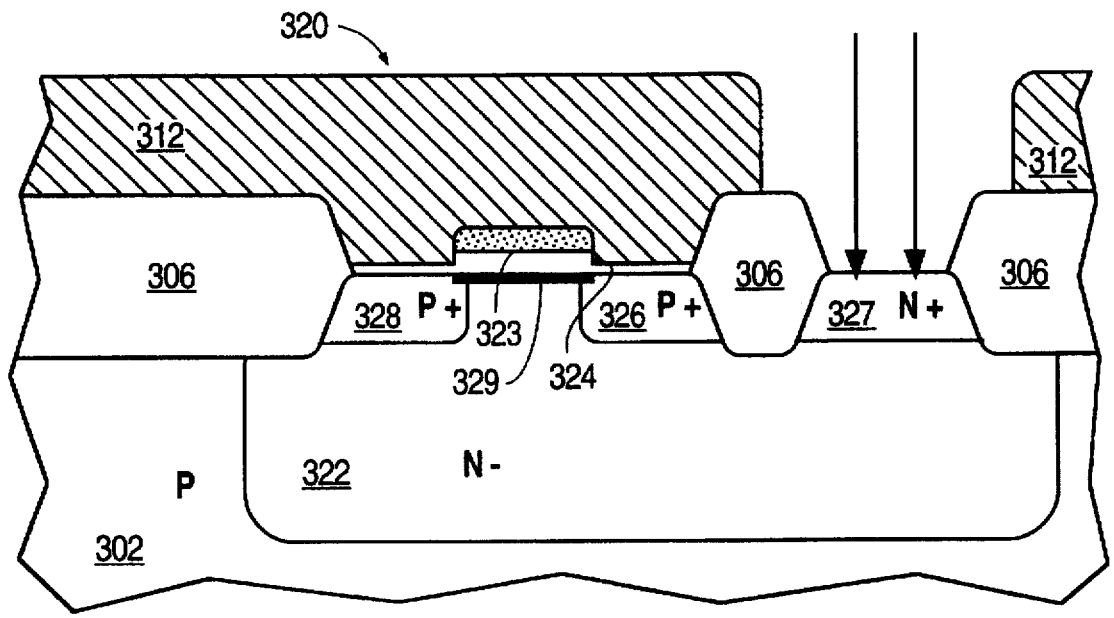
Figure 8C:
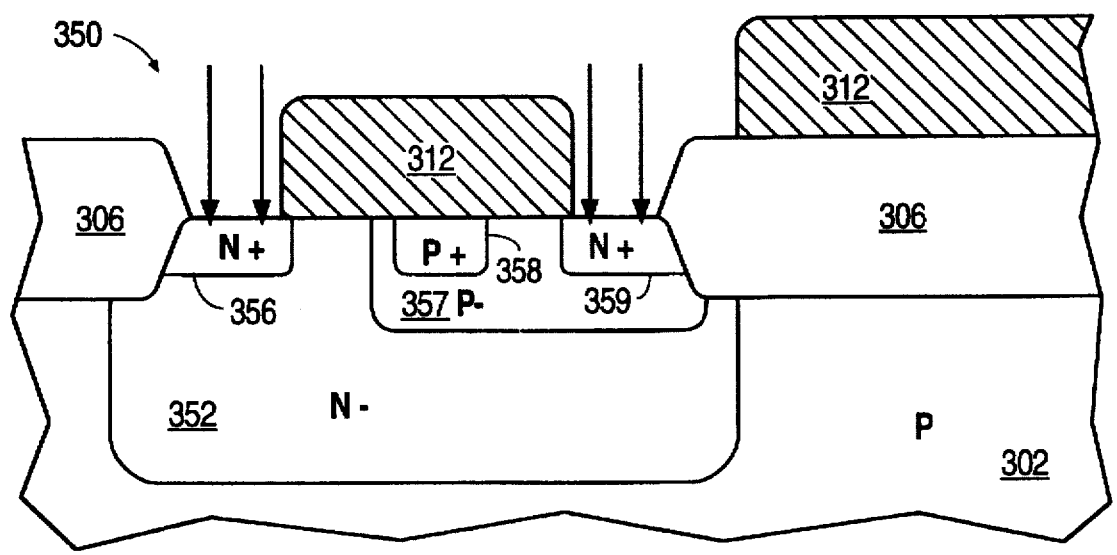
Figure 8B:
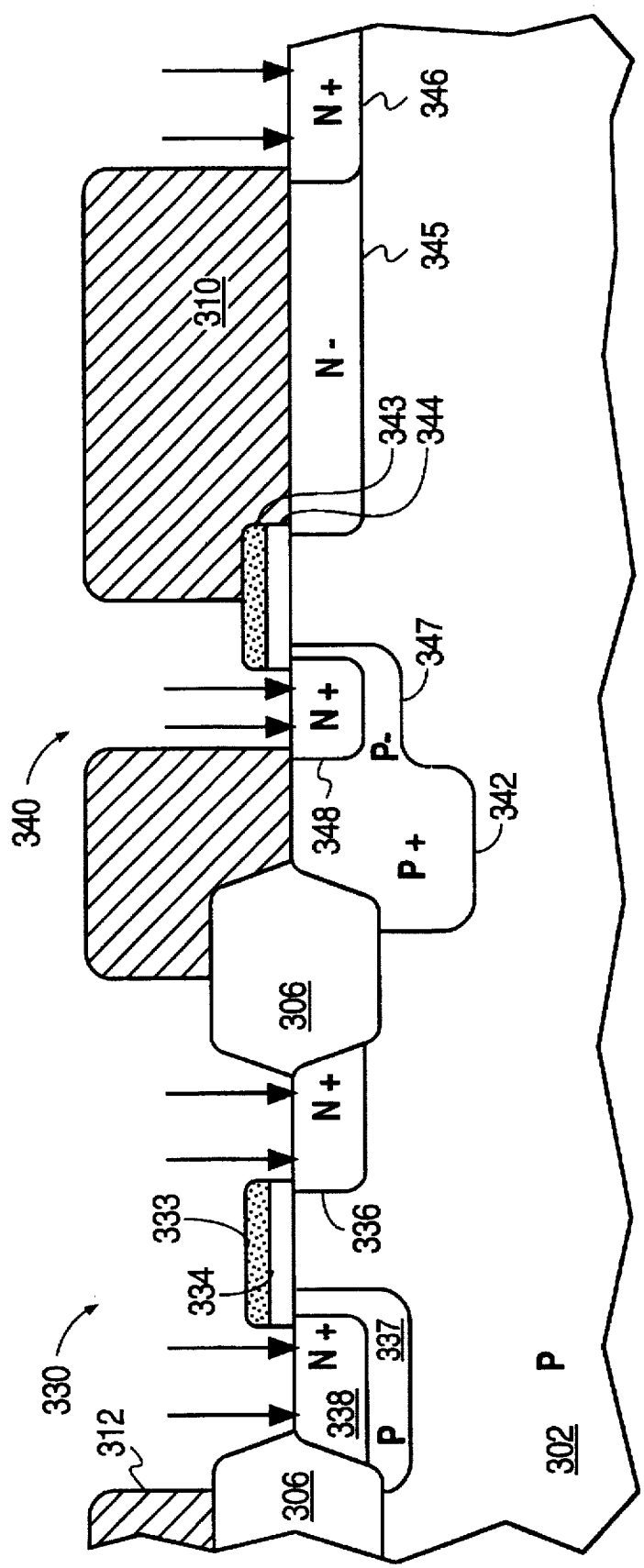

The electrically completed devices prior to metallization are shown in FIG. 8. The steps for fabricating the FIG. 8 structure are as follows. A layer of photoresist 312 is deposited and patterned to open windows into portions of the active areas in which n+ regions are to be formed, such as, for example, n-well contact region 327 to allow electrical contact to the body of the PMOS in device region 320, the source 338 and drain 336 of the NMOS in device region 330, the source 348 of the high voltage LDMOS in device region 340, and the drain contact diffusion 346 of the high voltage LDMOS into which the n− drift region 345 abuts. As indicated in FIG. 8C, the n+ regions further include the collector contact 356 for the collector 352 of the NPN transistor in device region 350, and the emitter 359 for the NPN transistor. An implant is made of a suitable n-type dopant such as phosphorus, arsenic, or both at a dose generally in the range of $4 \times 10^{15}$ to $9 \times 10^{15}$ atoms/cm$^2$ and an energy generally in the range of 60 to 120 keV, followed by a drive-in at, for example, 1100° C. for 30 minutes. Note that the p+ and n+ implants diffuse simultaneously, and that the root Dt of the diffusion is sufficiently small to avoid excessive diffusion of the threshold adjusting implant. Alternatively, the dopants may be activated by a subsequent reflow process.

Next, planarization, metallization, passivation, dicing, and packaging proceed in any suitable low temperature, short diffusion manner to complete the integrated circuit. An exception would be the use of a reflow step in the planarization process for activating the dopant.

Figure 9:
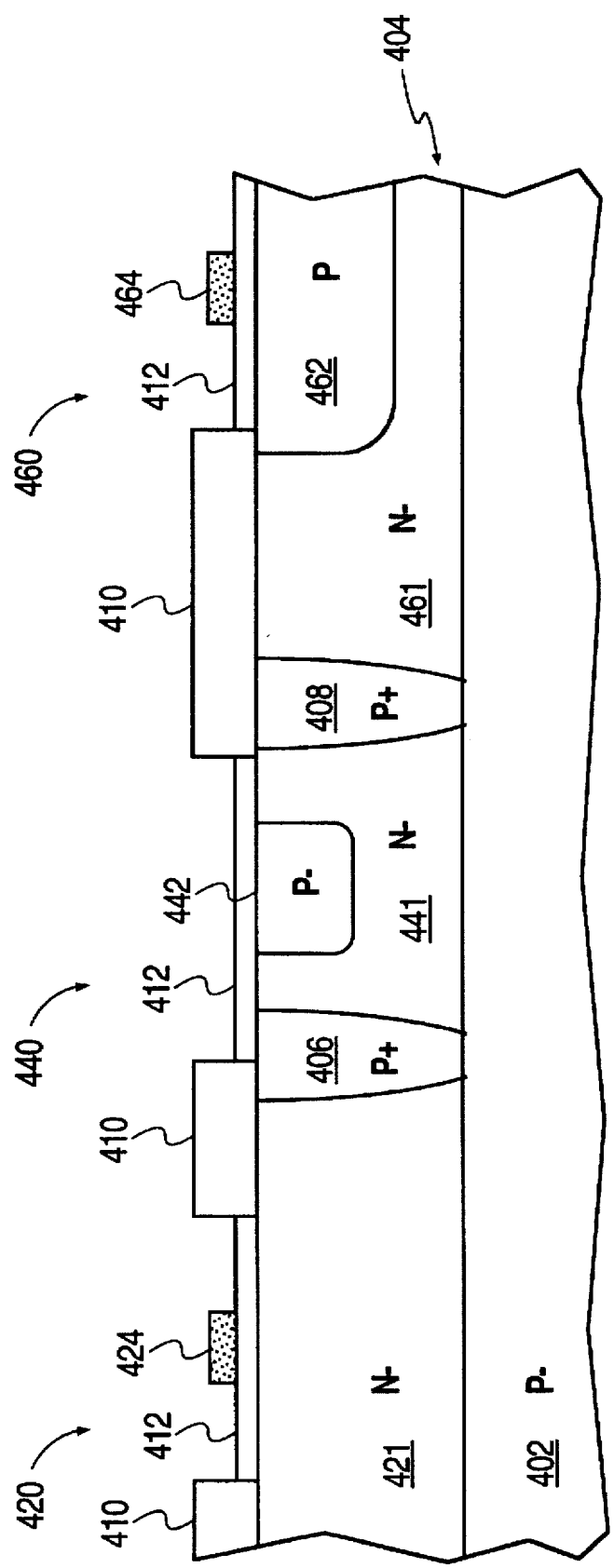

The implementation of a PMOS threshold adjust in a junction isolation BiCMOS process such as that shown in FIGS. 9–12 is similar to the implementation of a PMOS threshold adjust described in association with the oxide isolation D/CMOS process of FIGS. 4–8. The process for forming the intermediate structure of FIG. 9 is as follows. A PMOS device is to be formed in device region 420, an NPN device is to be formed in device region 440, and an NMOS device is to be formed in device region 460. The BiCMOS junction isolation process begins with a lightly doped (5 ohm-cm to 20 ohm-cm) p-type substrate 402 on which an epitaxial silicon layer 404, which ultimately will be the collector region of the NPN transistors, is grown in any suitable manner. Buried layers (not shown), if desired, are formed in any suitable manner prior to epitaxial growth. The epitaxial silicon layer 404 is lightly doped n-type.

The first masked diffusion (absent a buried layer diffusion) is the isolation diffusion. A thermal oxide is grown, and active areas in the device regions 420, 440 and 460 are defined by opening windows into the isolation regions such as 406 and 408. A high concentration p+ diffusion is used to form isolation regions 406 and 408, which electrically separate the epitaxial silicon layer 404 into an n-body region 421 in the PMOS device region 420, an n– collector 441 in the NPN device region 440, and an n-region 461 underlying the p-well 462 in the NMOS device region 460. The oxide is removed or patterned and etched and a thermal oxide 410 is regrown and patterned to open windows into the p-well regions such as p-well 462, which are formed by diffusion of a p-type dopant. A field doping and a field oxide (not shown) are made in any suitable manner such as by the LOCOS or ISOPLANAR processes. Next, a gate oxide 412 is thermally grown, and polysilicon is deposited and defined to make the PMOS gate 424 and the NMOS gate 464. Next, a layer of photoresist (not shown) is deposited and patterned to form openings into the base regions of the NPN transistors, followed by a p-type implant and drive in to form base 442. A suitable p-type dopant such as boron is implanted at a dose generally in the range of $3 \times 10^{13}$ to $8 \times 10^{14}$ atoms/cm$^2$ and an energy generally in the range of 60 to 150 keV, and is driven in at a temperature generally in the range of 1050° to 1150° C. for a time generally in the range of 15 to 600 minutes. Mote that the base mask step can be modified to create symmetric p-body PMOS devices by opening the PMOS active areas to the base implant, depending on whether the bipolar and DMOS are designed for compatibility, and to create asymmetric p-body PMOS devices by opening PMOS source areas to the base implant.

The process steps for forming the intermediate structure of FIG. 10 are as follows. A photoresist layer 414 is deposited and patterned to open windows into the PMOS device region 420 and into selected areas of the NPN device region 440 and the NMOS device region 460. An implant of a suitable p– type dopant such as boron is made at a dose generally in the range of $5 \times 10^{14}$ to $5 \times 10^{15}$ atoms/cm$^2$ and an energy generally in the range of 50 to 120 keV, followed by a drive-in at a temperature generally in the range of 1050° to 1150° C. for a time generally in the range of 15 to 60 minutes to form PMOS source 426 and PMOS drain 428, NPN base contact 444, and NMOS body contact 466.

Note that typically a threshold adjust implant is needed in this process. The body region 421 of the PMOS in device region 420 and the collector 441 of the NPN in device region 440 begin as the same n– doped epitaxial silicon material. To achieve a low NPN device collector resistance, which is usually desirable, the n– doping concentration of the epitaxial silicon is made to be in the vicinity of $2 \times 10^{16}$ atoms/cm$^3$. This level of doping is unattractive for making a low threshold PMOS device in the device region 420, so that a threshold adjust implant is needed for the PMOS in the device region 420. While the threshold adjust implant could be made prior to the polysilicon deposition, such an implant would be subject to the high temperature and long diffusions needed to form the p– type base 442 (FIG. 9) in the NPN device region 440, and would be driven in too deeply to be effective.

The solution is shown in FIG. 11. As in the previously described D/CMOS process, the threshold adjust implant is effective in the channel region between source 426 and drain 428, since the relatively low dose implant is made at such an energy that it penetrates through the polysilicon gate 424 and underlying gate oxide, and stops just in the silicon to form a region 430 of p-type implanted material that is thin so as to avoid leakage but sufficient to lower the threshold of the PMOS. In the source, drain, and contact regions such as 426, 428, 444, and 466, a high concentration of p+ dopant is already present so that the relatively low dose threshold adjust implant is inconsequential. Note that the threshold adjust implant occurs subsequent to the base diffusion, so that the low threshold PMOS device created in device region 420 is independent of other devices requiring long diffusions after polysilicon deposition, such as the NPN device in device region 440.

Figure 12:
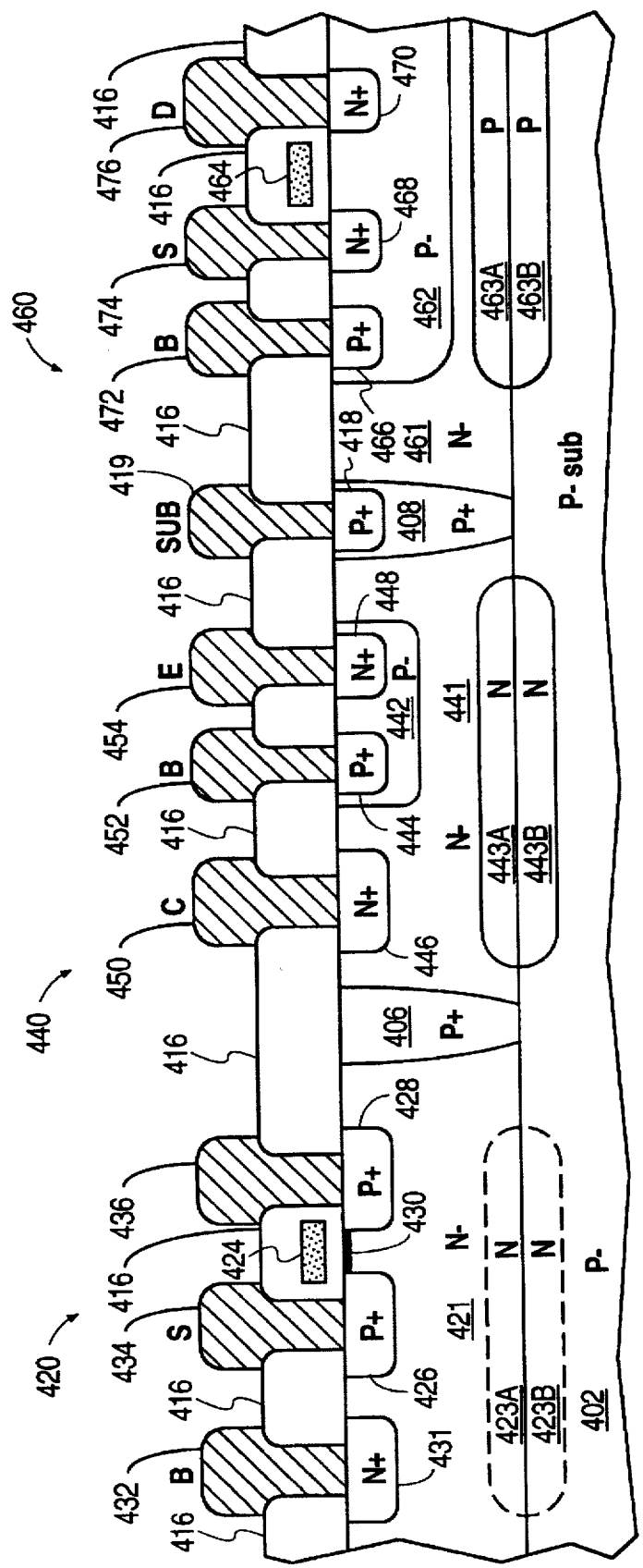

The completed integrated circuit prior to passivation is shown in FIG. 12. The PMOS device in device region 420 includes the gate 424, a threshold-adjusted channel 430 between the source 426 and drain 428, an n+ body contact region 431, body contact metallization 432, source contact metallization 434, and drain contact metallization 436. The NPN device in device region 440 includes collector 441 and collector contact region 446 and collector contact metallization 450, base 442 and base contact region 444 and base contact metallization 452, emitter 448 and emitter contact metallization 454, and substrate contact region 418 and substrate contact metallization 419. The NMOS device in device region 460 includes the gate 464, a channel between the source 468 and the drain 470, a p+ body contact region 466, body contact metallization 472, source contact metallization 474, and drain contact metallization 476. The n+ source and drain regions and body contacts are formed in a mask step following threshold adjust involving an implant of a suitable n-type impurity such as phosphorus or arsenic or both at a dose generally in the range of $4 \times 10^{15}$ to $1 \times 10^{16}$ atoms/cm$^2$ and an energy generally in the range of 80 to 120 keV, followed by a drive-in at a temperature generally in the range of 1050° to 1150° C. for a time generally in the range of 15 to 45 minutes. Note that if desired, the boron source could be diffused at this time, which would avoid the earlier source diffusion. Generally across the integrated circuit, insulator 416 typically comprises a variety of oxide films varying from place to place, depending on process design choice, and may include portions of the oxide 410, the gate oxide 412, and newly deposited or grown oxide. Optionally, buried layers 423 (n-type), 443 (n-type), and 463 (p-type) underlying device regions 420, 440 and 460 respectively are provided. Moreover, as is known in the art, various alternative buried layer arrangements are possible, including one in which the buried layer 463 merges with the p-well 462.

Figure 13:
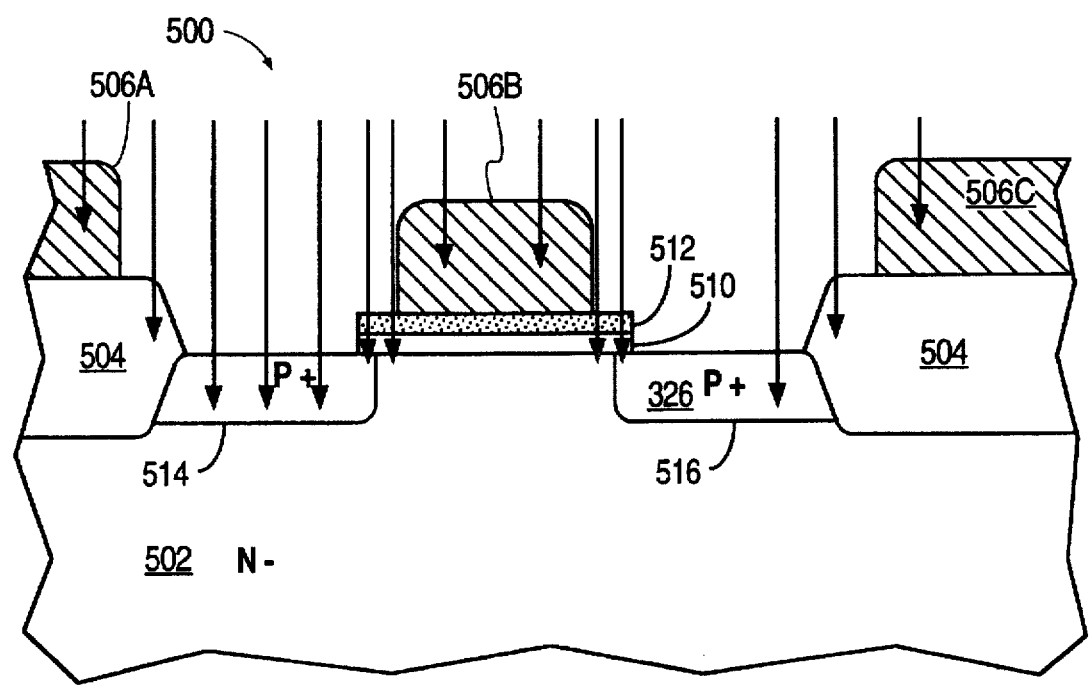
FIG. 13 is a cross-sectional view of a PMOS device region in accordance with a variation of the D/CMOS and BiCMOS processes of FIGS. 4-12.

In a variation of the D/CMOS and BiCMOS processes described above, two classes of PMOS devices, threshold-adjusted and not threshold-adjusted, are achieved in the same integrated circuit. In the D/CMOS and BiCMOS processes shown in FIGS. 7 and 11, a window is opened through photoresist layer 310 or 414 into the active area of the PMOS device region 330 (FIG. 7) or 420 (FIG. 11). The variation is illustrated in FIG. 13, which shows a PMOS device region 500 after implant and diffusion of source 514 and drain 516 in the n-type substrate 502. Other structural features shown include the field oxide 504, the gate oxide 510, and the gate polysilicon 512. The photoresist layer 506 corresponds to the photoresist layers 310 of FIG. 7 and 414 of FIG. 11, except that a portion of the photoresist layer 506 is allowed to remain on the gate polysilicon 512. Generally, the polysilicon 512 prevents the high energy threshold adjust implant, shown in FIG. 13 by the vertical arrows, from reaching into structures in which it is not desired. In the vicinity of the gate polysilicon 512, the threshold adjust implant stops in the photoresist feature 506B, and penetrates into the channel between the source 514 and the drain 516 only at the channel ends over which, due to alignment tolerances, photoresist typically is absent. The general area of maximum implant concentration is indicated by the placement of the arrowheads in the FIG. 13.

In carrying out the threshold adjust process steps described herein, the high energy threshold implant is made with any suitable ion implanter such as, for example, the 3 MeV singly ionized implanter available from Genus Incorporated, Mountain View, Calif. While other types of implanters such as doubly-ionized implanters can achieve the desired energy and can be used if desired, some models exhibit high degrees of variability which may be excessive for threshold adjust implanting. Some implanters, such as the model 350D, available from Varian Corporation, Palo Alto, Calif., provide an adequate vacuum for accurately controlling doubly ionized implants.

The controllability of the high energy threshold adjust technique described herein depends on three parameters to determine the net charge incorporated into the silicon channel region. These parameters are (a) the thicknesses of the polysilicon gate and gate oxide films; (b) the implant energy; and (c) the implant dose. We have found that the dominant source of variability is the thickness control of the polysilicon and oxide, the blocking coefficients of which are similar to one another, to a first order. Implant energies below about 210 keV show a significant dependence on polysilicon and oxide thickness for the typical combined gate thickness of 0.5 μm used in 5 volt CMOS processes. In contrast, implant energies of about 250 keV and greater provide a threshold that is independent of polysilicon and oxide thickness up to about 5250 Å, and drops only about 200 mV in the next 250 Å. The reason for the improved threshold insensitivity to the polysilicon-oxide thickness is that a significant portion of the implanted gaussian charge distribution achieved with the high energy implant lies within the silicon and within the electrostatic control of the gate.

Figure 14:
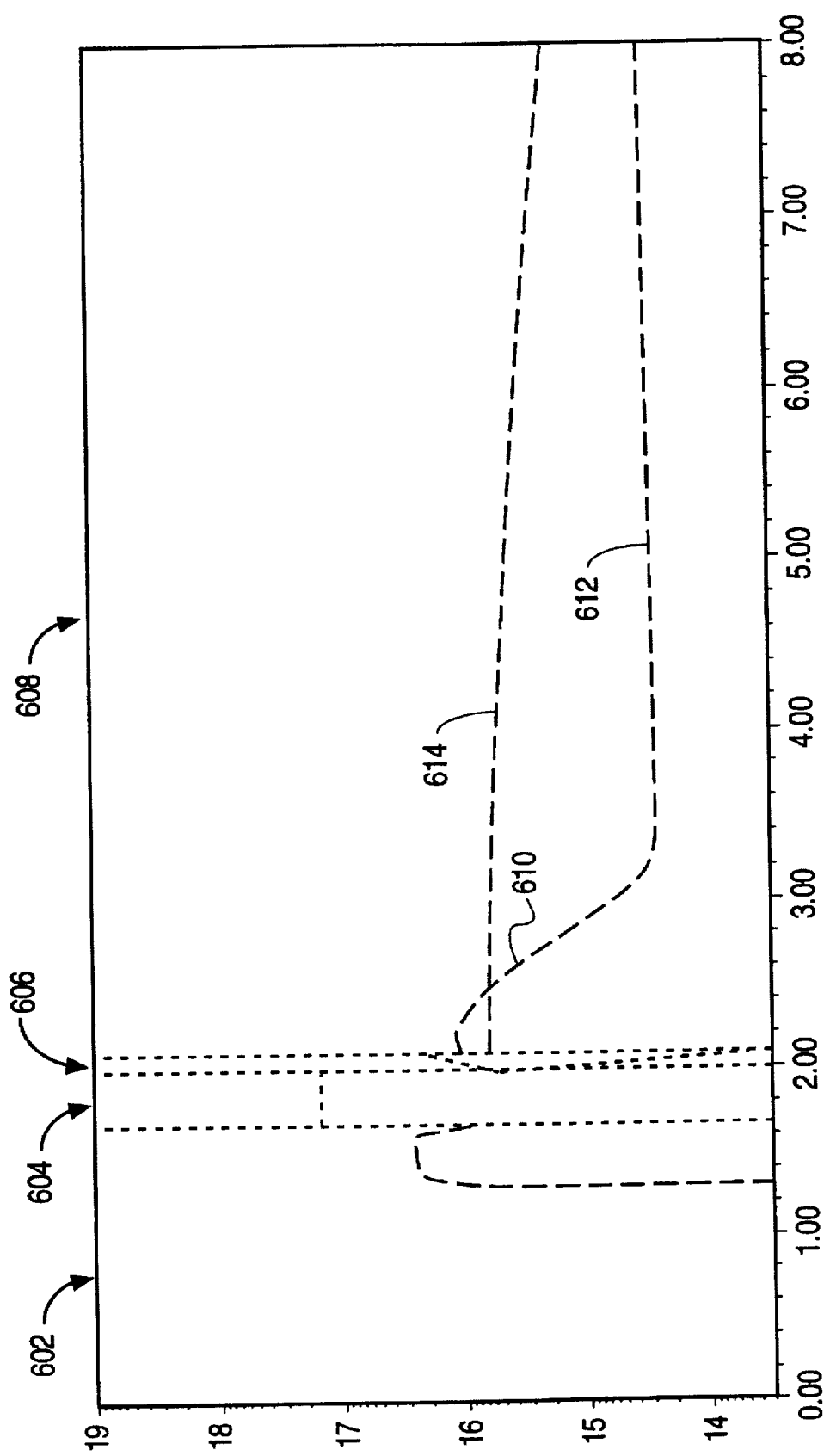
FIG. 14 is a graph of p-type and n-type dopant profiles under the gate region of the PMOS intermediate structure of FIG. 1, resulting from the implants shown in FIG. 1.
Figure 15:
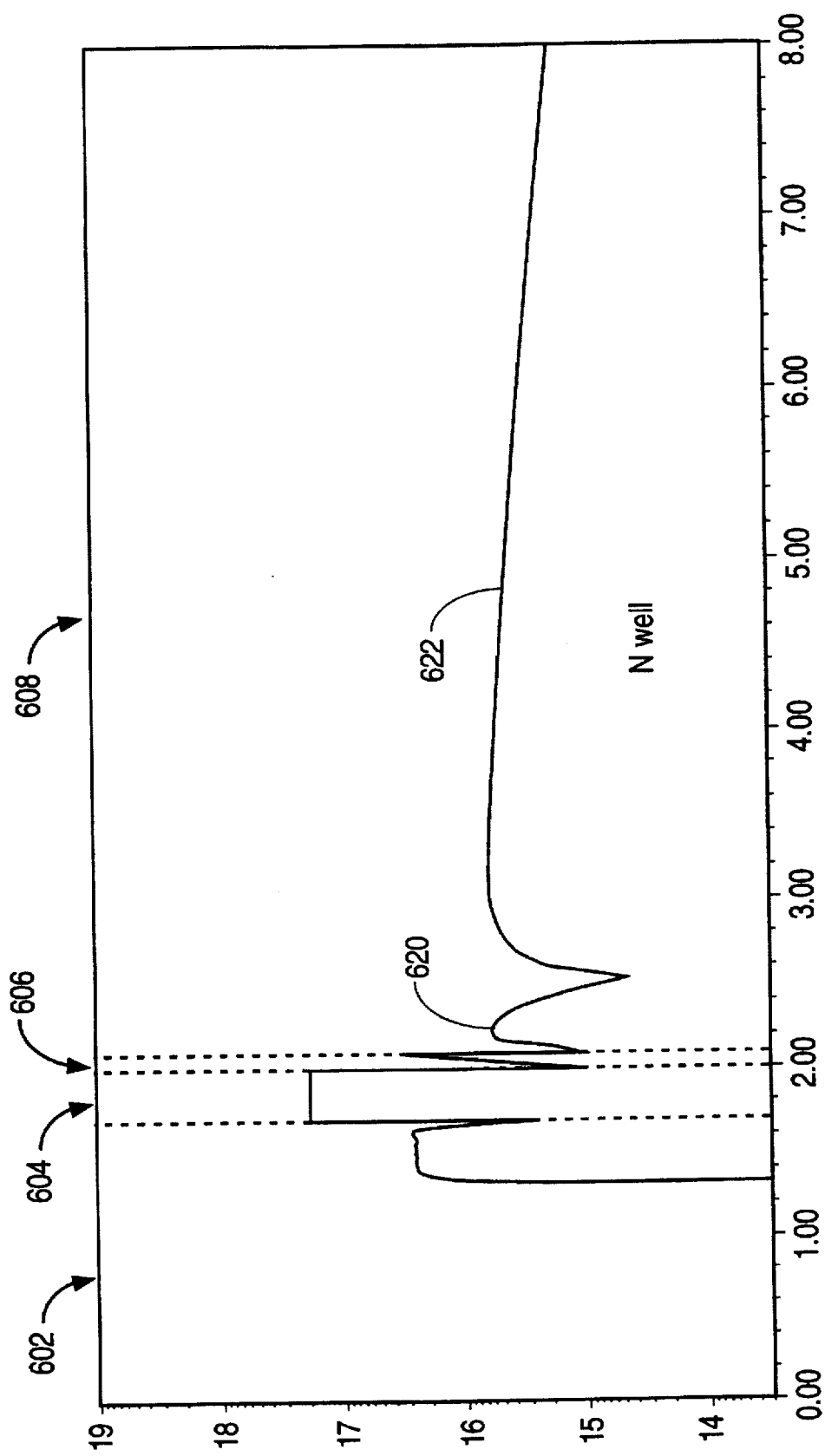
FIG. 15 is a graph of a composite dopant profile under the gate region of the PMOS intermediate structure of FIG. 1, resulting from the implants shown in FIG. 1.

We simulated a MOS capacitor formed in an n-well with a polysilicon gate thickness of 0.5 μm and a gate oxide thickness of 0.1 μm. The high energy threshold implant was boron at a dose of $7.7 \times 10^{11}$ atoms/cm² and an energy of 250 keV. The distribution of various charges in the simulated device are shown in the graph of FIG. 14, in which the vertical axis is the log of the dopant concentration in atoms per cubic centimeters ("atoms/cm³"), and the horizontal axis represents distance in microns. Region 602 is a BPSG layer, region 604 is the gate polysilicon, region 606 is the gate oxide, and region 608 is epitaxial silicon. The distribution of the p-type substrate impurity is represented by line 612, which shows a concentration varying with depth from about $2 \times 10^{14}$ atoms/cm³ to about $3 \times 10^{14}$ atoms/cm³. The distribution of the n-type n-well impurity is represented by line 614, which shows a concentration varying with depth from about $2 \times 10^{15}$ atoms/cm³ to about $6 \times 10^{15}$ atoms/cm³. The distribution of the p-type threshold adjust impurity is represented by line 610, which shows a concentration peaking in the epitaxial layer 608 at about $1 \times 10^{16}$ atoms/cm³ and falling off slightly toward the surface of the epitaxial layer 608 and falling off within about 0.4 μm of the surface of the epitaxial region 608 toward the substrate concentration. The composite distribution of FIG. 15 shows that the threshold adjust implant actually converts a region of the epitaxial layer 608 near its surface to p-type to a junction at about 0.4 μm from the surface, as represented by curve 620. The rest of the n-well remains n-type, as represented by curve 622.

The integral of the total charge over the area within electrostatic control of the gate is determinative of threshold voltage. Typically, the gate of a 5 volt device exerts electrostatic control a distance of about 0.5 μm to 1.5 μm into the silicon, through about 0.03 μm to 0.2 μm of gate oxide. It is this region into which the threshold adjust charge preferably is placed. Charge placed outside of this region does not participate in threshold adjustment, and if not fully depleted will cause leakage. The charge in the region converted to p-type by the high energy $V_{tp}$ threshold adjust implant is completely depleted at $V_{gs}=0$, which avoids leakage in the PMOS enhancement mode device. In contrast, the implant dose needed in a conventional channel doping technique to provide the same degree of threshold adjust following the body diffusion would be so large and its diffusion so extensive that the resulting charge would not be fully depleted at=0. Hence, leakage would occur.

The values of the parameters of (a) the thicknesses of the polysilicon gate and gate oxide films; (b) the implant energy; and (c) the implant dose are set to place a significant portion of the implanted gaussian charge distribution achieved with the high energy implant within the silicon and within the electrostatic control of the gate. Less implant energy is needed for a thinner gate structure, while greater implant energy is needed for a thicker gate structure. Generally, implant energies in the range of 150 keV to 350 keV are suitable for the polysilicon-oxide thicknesses ordinarily encountered. Polysilicon typically ranges from 3,000 Å to 7,000 Å, while gate oxide typically ranges from 200 Å to 1300 Å. Some processes are able to realize gate oxides as thin as 50 Å, and the high energy threshold implant technique is entirely satisfactory for use in such processes.

It will be appreciated that the final resulting threshold of a high energy implant adjusted device may be either positive or negative, meaning that the device after threshold adjustment may be either enhancement mode (normally off) or depletion mode (normally on). Whether enhancement mode or depletion mode, the gate of the threshold adjusted device is capable of being bias (either positive or negative) so as to turn the device completely off. In other words, conduction within the implanted region remains within electrostatic control of the gate.

Figure 16:
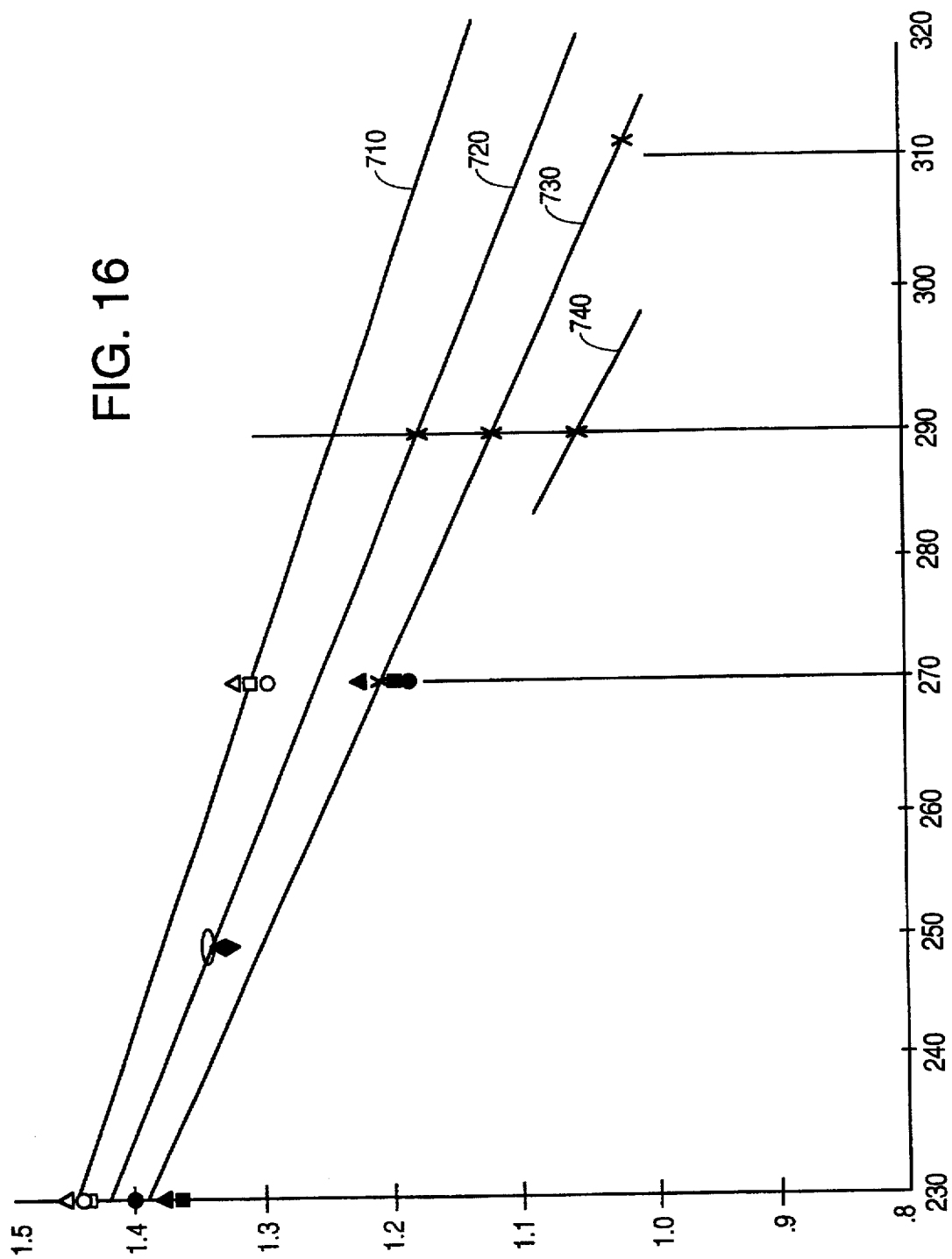
FIG. 16 is a graph showing the threshold voltage as a function of implant energy, for various boron doses.

FIG. 16 show $V_{tp}$ in volts (vertical axis, in 0.1 volt increments) as a function of the implant energy in keV (horizontal axis, in 10 keV increments) for lines of constant dose. The MOSFET gate oxide is 580 Å in thickness. The gate electrode is 5000 Å of polysilicon doped n-type after deposition with phosphorus. The unadjusted threshold $V_{to}$ extracted in the saturation region is 1.74 volts. The lines represent a straight line fit to measured values (denoted by various points noted on the graph) for various constant implant dose conditions. Specifically, line 710 represents a threshold adjust dose of $7.4 \times 10^{11}$ atoms/cm², line 720 represents a threshold adjust dose of $8.0 \times 10^{11}$ atoms/cm², line 730 represents a threshold adjust dose of $8.6 \times 10^{11}$ atoms/cm², and line 740 represents a threshold adjust dose of $9.2 \times 10^{11}$ atoms/cm².

The various symbols representing measured data points refer to several experimental fabrication test runs. Measurements on these physical devices agree well with the predicted linear threshold dependence on implant dose and energy, which evidences the desired characteristic of independence from variations in gate polysilicon and gate oxide thickness.

Note also that a given threshold can be achieved by different combinations of dose and energy. Since threshold variability tends to be greater at higher doses, as denoted by a higher slope in FIG. 16, threshold variability can be minimized by selecting a relatively high energy, low dose implant to achieve a given threshold.

Figure 17:
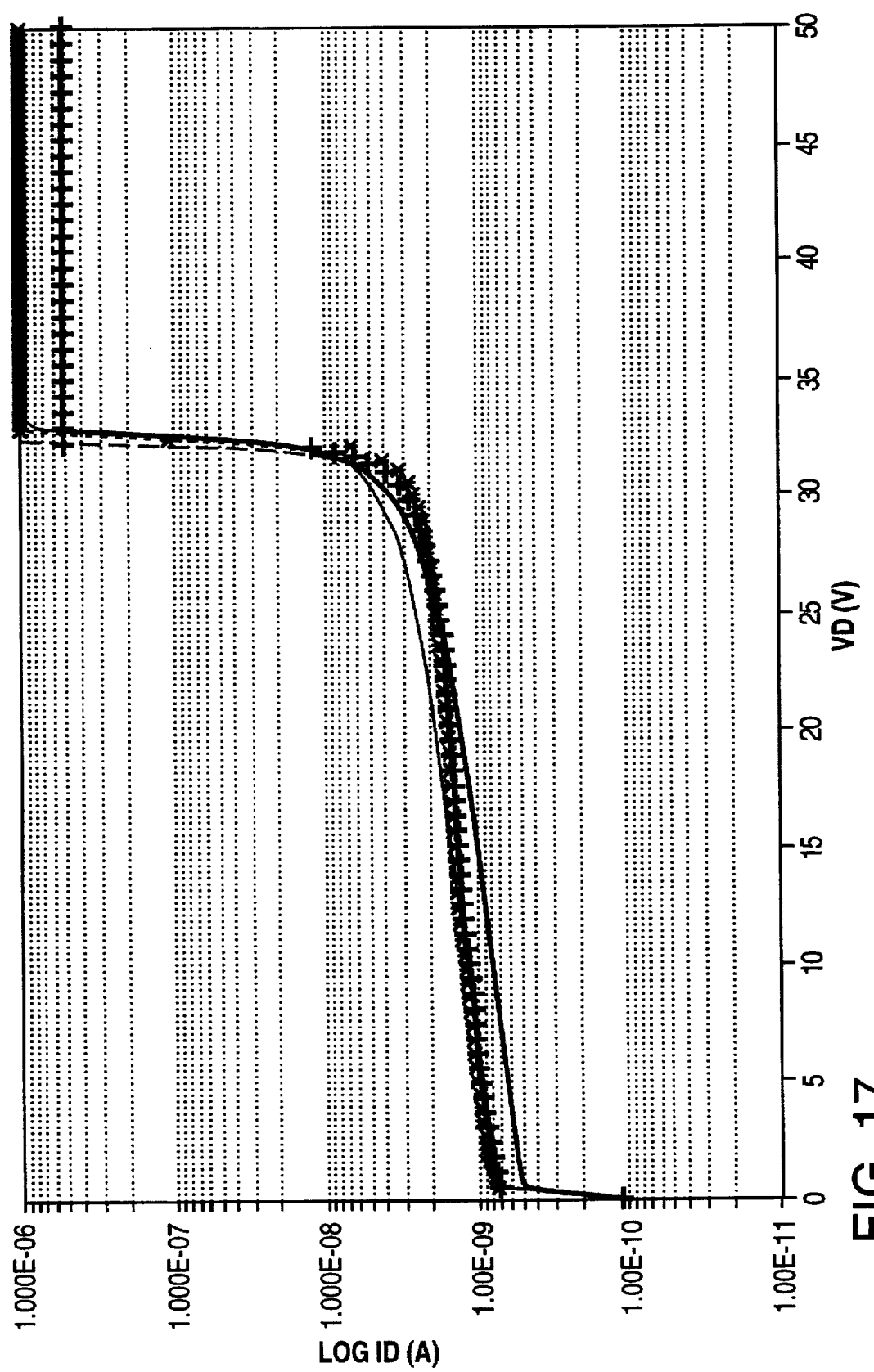
FIG. 17 is a graph showing measured values of leakage drain current versus drain voltage for a variety of similarly constructed enhancement mode devices having different threshold adjust implants.

FIG. 17 shows a graph of measured values of leakage drain current versus drain voltage for a variety of similarly constructed enhancement mode devices having different threshold adjust implants. The device characteristics were measured at a high temperature of 150° C. The thin solid line represents behavior of a device having a threshold adjust implant of $8.6 \times 10^{11}$ atoms/cm$^2$ boron at 270 keV, the line marked with "+" represents behavior of a device having a threshold adjust implant of $8.0 \times 10^{11}$ atoms/cm$^2$ boron at 290 keV, the line marked with "*" represents behavior of a device having a threshold adjust implant of $9.2 \times 10^{11}$ atoms/cm$^2$ boron at 290 keV, the dashed line represents behavior of a device having a threshold adjust implant of $8.6 \times 10^{11}$ atoms/cm$^2$ boron at 310 keV, and the thick solid line represents behavior of a device having no threshold adjust implant. The graph shows that the characteristics of the threshold adjusted devices are comparable to the characteristics of the unadjusted devices, which is to say that none of the devices had significant leakage up to breakdown.

The thickness of material used to mask regions that need to be protected from the high energy p+ threshold adjust implant depends on the implant energy, following a relationship that is well known in the art. For example, according to the previously referenced work Semiconductor Technology Handbook, (graph entitled "Masking Thickness Required, Boron and Antimony Implants") about 1.1 µm of photoresist is needed to limit the transmission of boron implanted at 250 keV to 0.0001%. For implant energies in the range of 150 keV to 350 keV, the photoresist thickness ranges from about 0.85 µm to about 1.25 µm. By using a 1.5 µm resist thickness, the process is made tolerant of process variations. Since photoresist typically is deposited to a thickness in excess of 1 µm, suitable protection is achieved by only a modest increase in photoresist thickness.

While the invention has been described with respect to the embodiments set forth above, other embodiments and variations not described herein may be within the scope of the invention. For example, the invention is not to be considered limited to the specific process described, or limited to the ranges or specific values of process parameters specified, as specific parameter values depend on the characteristics desired of the integrated circuit devices in a manner well known in the art. Accordingly, other embodiments, variations and improvements not described herein may be within the scope of the invention, which is defined by the following claims.

What is claimed is:

1. A field effect device comprising:

a source region disposed in a semiconductor body;

a drain region disposed in the semiconductor body;

a gate disposed over a surface of the semiconductor body and insulated therefrom;

a body region disposed in the semiconductor body and generally underlying said gate, said body region comprising a threshold adjust region having an impurity dopant concentration different from an impurity dopant concentration in a region of said body region adjacent said threshold adjust region, said threshold adjust region being located sufficiently near the surface of said semiconductor body to lower the threshold voltage of said device and being sufficiently thin such that current leakage is avoided when said device is in an off condition; and a diffusion disposed in said semiconductor body and bounded by a PN junction, said diffusion having been formed at least in part by a thermal process performed after the formation of said gate, a diffusion coefficient (D) of a portion of said semiconductor body in which said diffusion is formed and a duration (t) of said thermal process being such that a root Dt of said thermal process equals at least 0.3 microns.

2. A field effect device as in claim 1 wherein the root Dt of said thermal process is such that a depth of said diffusion is at least 1.0 microns below a surface of said semiconductor body.

3. A field effect device as in claim 2, wherein the root Dt of said thermal process is such that a depth of said diffusion is at least 4.0 microns below a surface of said semiconductor body.

4. A field effect device as in claim 3, wherein said source and drain regions are p-type regions, said body region is an n-type region, and said threshold adjust region is a p-type region.

5. A field effect device as in claim 3, wherein said source and drain regions are n-type regions, said body region is a p-type region, and said threshold adjust dopant is an n-type region.

6. A field effect device as in claim 3, wherein said threshold adjust dopant is present at a concentration for establishing both a positive threshold bias and an off-condition of the field effect device at a gate bias within the normal range of gate biases for the field effect device.

7. A field effect device as in claim 3, wherein said threshold adjust dopant is present at a concentration for establishing both a negative threshold bias and an off-condition of the field effect device at a gate bias within the normal range of gate biases for the field effect device.

8. The field effect device of claim 1 wherein the threshold adjust region is located within about 0.4 µm of the surface of the semiconductor body.

9. The field effect device of claim 1 wherein said device is an enhancement mode device.

10. The field effect device of claim 1 wherein said device is a depletion mode device.

11. The field effect device of claim 1 wherein said threshold adjust region is fully depleted when said gate is biased at a specified second voltage equal to the voltage at the source region.

12. The field effect device of claim 1 wherein said electrostatic control of said gate extends into said semiconductor body a distance which is in the range of from 0.5 µm to 1.5 µm.

* * * * *